(12) United States Patent
Shukla et al.

(10) Patent No.: US 9,188,861 B2
(45) Date of Patent: Nov. 17, 2015

(54) PHOTOPOLYMERIZABLE COMPOSITIONS FOR ELECTROLESS PLATING METHODS

(71) Applicants: Deepak Shukla, Webster, NY (US); Mark R. Mis, Rush, NY (US)

(72) Inventors: Deepak Shukla, Webster, NY (US); Mark R. Mis, Rush, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 72 days.

(21) Appl. No.: 14/197,293

(22) Filed: Mar. 5, 2014

(65) Prior Publication Data

US 2015/0253661 A1 Sep. 10, 2015

(51) Int. Cl.
*G03F 7/004* (2006.01)
*G03F 7/038* (2006.01)
*G03F 7/16* (2006.01)

(52) U.S. Cl.
CPC .............. *G03F 7/038* (2013.01); *G03F 7/0045* (2013.01); *G03F 7/16* (2013.01)

(58) Field of Classification Search
CPC ........... G03F 7/038; G03F 7/16; G03F 7/028; G03F 7/029; G03F 7/031; G03F 7/0045
USPC .......................................... 430/16, 18, 280.1
See application file for complete search history.

(56) References Cited

U.S. PATENT DOCUMENTS

| | | | |
|---|---|---|---|
| 4,273,668 A | 6/1981 | Crivello | |
| 6,417,244 B1 | 7/2002 | Wellinghoff et al. | |
| 6,630,009 B2 | 10/2003 | Moussa et al. | |
| 6,667,360 B1 | 12/2003 | Ng et al. | |
| 7,875,416 B2 | 1/2011 | Park et al. | |
| 7,923,110 B2 | 4/2011 | Park et al. | |
| 8,282,860 B2 | 10/2012 | Chung et al. | |
| 8,313,571 B2 | 11/2012 | Nawrocki et al. | |
| 2007/0080345 A1 | 4/2007 | Joo et al. | |
| 2008/0032061 A1* | 2/2008 | Watanabe et al. ............. | 427/515 |
| 2013/0075946 A1 | 3/2013 | Petcavich | |

FOREIGN PATENT DOCUMENTS

| | | |
|---|---|---|
| EP | 1 434 248 A2 | 6/2004 |
| EP | 2 363 430 A1 * | 9/2011 |
| WO | WO 2013/063034 | 5/2013 |
| WO | WO 2013/063051 | 5/2013 |
| WO | WO 2013/063084 | 5/2013 |
| WO | WO 2013/063173 | 5/2013 |
| WO | WO 2013/063183 | 5/2013 |
| WO | WO 2013/063188 | 5/2013 |
| WO | WO 2013/063202 | 5/2013 |
| WO | WO 2013/165681 | 11/2013 |
| WO | WO 2013/169345 | 11/2013 |

* cited by examiner

*Primary Examiner* — John A McPherson
(74) *Attorney, Agent, or Firm* — J. Lanny Tucker

(57) ABSTRACT

A photopolymerizable composition has five essential components: (a) a photopolymerizable epoxy material, (b) a photoacid generator such as an onium salt, (c) electron donor photosensitizer having an oxidation potential of at least 0.4 V and up to and including 3 V vs. SCE, and (d) metal particles. This photopolymerizable composition can be applied or printed onto one or both sides of various substrates to form articles that can be used to form electrically conductive materials. Methods for using the photopolymerizable compositions include electroless plating methods that can be carried out in roll-to-roll printing systems once various photocured patterns are formed from the photopolymerizable compositions.

15 Claims, 5 Drawing Sheets

PHOTOPOLYMERIZABLE COMPOSITIONS FOR ELECTROLESS PLATING METHODS

RELATED APPLICATION

Reference is made to copending and commonly assigned U.S. Ser. No. 14/174,879 filed Feb. 7, 2014 by Shukla and Mis.

FIELD OF THE INVENTION

This invention relates to photopolymerizable compositions that include metal particles and a photocurable epoxy compound, which composition can be used to provide conductive metal patterns using electroless plating methods. This invention also relates to articles having patterns of the photopolymerizable composition and its cured counterparts and to methods for their use.

BACKGROUND OF THE INVENTION

Various photopolymerizable composition comprising both ethylenically unsaturated compounds and epoxies are known in the art. Ethylenically unsaturated compounds, such as acrylate derivatives, can be polymerized by exposure to radiation, typically ultraviolet light, in the presence of a photoinitiating system.

Photoinitiators can be either cleavage type or abstraction type initiators. Typically, an abstraction type photoinitiating system includes (1) a compound capable of initiating polymerization of the ethylenically unsaturated compound upon exposure to radiation (a "photoinitiator"), and optionally (2) a co-initiator or synergist, that is, a molecule that serves as a hydrogen atom donor. Useful co-initiators or synergists are typically alcohols, tertiary amines, amides, or ethers that have labile hydrogen atoms attached to a carbon adjacent to a heteroatom. Currently, commercially available photoinitiators include benzophenones and derivatives thereof and thioxanthone derivatives.

Epoxies are generally polymerized by exposure to radiation such as ultraviolet light in the presence of an onium salt photoinitiating system. It is well known that various onium salts, upon exposure to radiation, are capable of forming a Bronsted acid, and that the Bronsted acid thus formed can cure a wide variety of materials including epoxies. See, for example, UV Curing: Science and Technology, edited by S. Peter Pappas and published (1978) by Technology Marketing Corporation, 64 Westover Road (Stamford, Conn. 06902) and U.S. Pat. No. 4,273,668 (Crivello). Acid generating onium salt photoinitiators are well known in the art and include, for example, diaryliodonium and triarylsulfonium salts. Useful counter anions for onium salts include complex metal halides such as tetrafluoroborate, hexafluoroantimonate, trifluoromethanesulfonate, hexafluoroarsenate, and hexafluorophosphate.

Polymer composites comprising metal or metal oxide nanoparticles have been developed and tested for various applications due to their potential for a variety of unique electrical, thermal, mechanical, or optical properties.

Photocurable polymer composites comprising metal or metal oxide nanoparticles are also known. For example, U.S. Pat. No. 6,417,244 (Wellinghoff et al.) discloses a photopolymerizable composition comprising a combination of monomers selected a bis-acrylate or bis-methacrylate in combination with metal oxide nanoparticles, which composition is used for dental restoration.

One major problem with the use of onium salts is that they do not absorb radiation out to 400 nm, and commonly must be used in combination with a light-absorbing photosensitizer in order to carry out photoinitiation at wavelengths longer than 300 nm. In addition, it has been found that in presence of certain metal nanoparticles, the absorption spectrum of commercially available sulfonium salts moves to shorter wavelengths.

Thus, it is desired to provide a photopolymerizable composition containing epoxy compounds and metal particles that can be photocured (photopolymerized) with high efficiency, thereby overcoming the problems noted above.

Copending U.S. Ser. No. 14/174,879 (filed Feb. 7, 2014 by Shukla and Mis) describes photopolymerizable compositions that address the noted problems and their use to provide conductive metal patterns using electroless plating. Further improvements are being sought and such improvements are the object of the present invention.

SUMMARY OF THE INVENTION

The present invention provides various embodiments that address the problems noted above and provide numerous advantages in photocuring to form photocured compositions that can be further used, for example in electroless plating methods, to provide conductive articles with predetermined conductive metal patterns for various purposes as described below.

The advantages described herein are particularly achievable using a photopolymerizable composition comprising:
  (a) a photopolymerizable epoxy material,
  (b) a photoacid generator (such as an onium salt),
  (c) an electron donor photosensitizer having an oxidation potential of at least 0.4 V and up to and including 3 V vs. SCE, and
  (d) metal particles, and optionally,
  (e) one or more free-radically polymerizable materials, and
  (f) one or more free radical photoinitiators.

This invention also provides various articles, for example precursor articles (without electroless plating), each article comprising a substrate and having thereon either a uniform layer or a pattern of any embodiment of the photopolymerizable composition of this invention. Thus, the present invention can provide an article either as an individual element or in multiple portions or elements in a continuous web (such as a continuous polymeric web).

Other articles of this invention comprise a substrate that has thereon either a photocured layer or a photocured pattern, each of which photocured layer or photocured pattern is derived from any embodiment of the photopolymerizable composition of this invention. In addition, these articles with photocured layers or patterns can be provided in a continuous polymeric web.

Some embodiments of the present invention include an article comprising a substrate and having thereon either a uniform electrolessly plated layer or an electrolessly plated pattern, each of which comprises an electrolessly plated metal deposited over a photocured composition that is derived from any embodiment of the photopolymerizable composition of the present invention.

Devices as described below are also provided by this invention, which devices comprise at least one article of the present invention comprising any embodiment of the photopolymerizable composition of the present invention. In many embodiments, such devices comprise two or more of the articles of the present invention.

Moreover, the present invention provides a method for providing an electrically conductive article, the method comprising:

(i) providing a continuous web of a transparent substrate, (ii) forming a photocurable pattern on at least a first portion of the continuous web using any embodiment of the photopolymerizable composition of this invention, (iii) exposing the photocurable pattern to radiation to form a photocured pattern on the first portion, and (iv) electrolessly plating the photocured pattern on the first portion with an electrically conductive metal.

In other embodiments, a method for providing a plurality of electrically conductive articles comprises:

(i) providing a continuous web of a transparent substrate, (ii) forming a photocurable pattern on at least a first portion of the continuous web using any embodiment of the photopolymerizable composition of this invention, (iii) exposing the photocurable pattern to radiation to form a photocured pattern on the first portion, (iv) electrolessly plating the photocured pattern on the first portion with an electrically conductive metal, and (v) repeating features (ii) through (iv) on one or more additional portions of the continuous web that are different from the first portion, using the same or different photopolymerizable composition.

Further, a method for providing a plurality of precursor articles, the method comprising:

(i) providing a continuous web of a transparent substrate, (ii) forming a first photocurable pattern on a first portion of the continuous web by applying any embodiment of the photopolymerizable composition of this invention to the first portion using a flexographic printing member, (iii') advancing the continuous web comprising the first portion comprising the first photocurable pattern to be proximate exposing radiation, and thereby forming a first photocured pattern on the first portion, (iv') forming a second photocurable pattern on a second portion of the continuous web by applying the same photopolymerizable composition of the present invention to the second portion using the same flexographic printing member, (v') advancing the continuous web comprising the second portion comprising the second photocurable pattern to be proximate exposing radiation, and thereby forming a second photocured pattern on the second portion, (vi') optionally, carrying out features (iv') and (v') one or more times on additional respective portions of the continuous web using the same photopolymerizable composition and the same flexographic printing member to form additional photocured patterns on the additional respective portions, and (vii') winding up the continuous web comprising multiple photocured patterns.

In still other embodiments of this invention, a method for providing a plurality of conductive metal patterns comprises:

providing a continuous web comprising multiple photocured patterns in respective portions, each photocured pattern being provided by irradiation of any embodiment of the photopolymerizable composition of the present invention, treating the continuous web comprising multiple photocured patterns with an electroless metal plating solution to provide multiple electrolessly plated metal patterns on the continuous web in the respective portions, and optionally, further treating the multiple electrolessly plated metal patterns with a capping metal to provide multiple capped electrically plated metal patterns on the continuous web.

The foregoing method can also be extended further by further comprising:

forming individual electrically conductive articles from the continuous web comprising multiple capped electrically plated metal patterns, and assembling the individual electrically conductive articles into the same or different individual devices.

The present invention solves problem associated photocuring of epoxy compounds in the presence of metal particles that can be in the form of individual metal nanoparticles or metal agglomerations formed from multiple individual metal nanoparticles. For example, it has been discovered that in the presence of metal particles, the absorption spectra of certain sulfonium salts undergo undesirable spectral shift to lower wavelengths (more "blue" wavelengths) thereby lowering their photocuring efficiency.

The photopolymerizable composition of the present invention and its use in various methods solve this problem. While the present invention involves a photo-initiated electron transfer reaction to an onium salt or other photoacid generator that generates a Brönsted acid, thereby causing polymerization of an epoxy compound, because the present invention relies on indirect electron transfer rather than direct excitation of an onium salt (such as a sulfonium salt), the spectral absorbance (or any shift of absorbance) of the onium salt is not important.

Successful use of the photopolymerizable composition of this invention involves an electron transfer process that is efficient in its use of photons (irradiation). Because (as noted above) the mechanism for using the present invention involves a photo-initiated electron transfer reaction, a relatively large change in yield of Brönsted acid is obtained even with only a small exposure to light (lower photons). This effect highly improves photocuring or photopolymerization efficiency and thereby increases sensitivity to curing irradiation. It also inherently improves storage stability of the inventive photopolymerizable composition that includes an epoxy compound that normally causes problems.

DETAILED DESCRIPTION OF THE INVENTION

Figure 1:
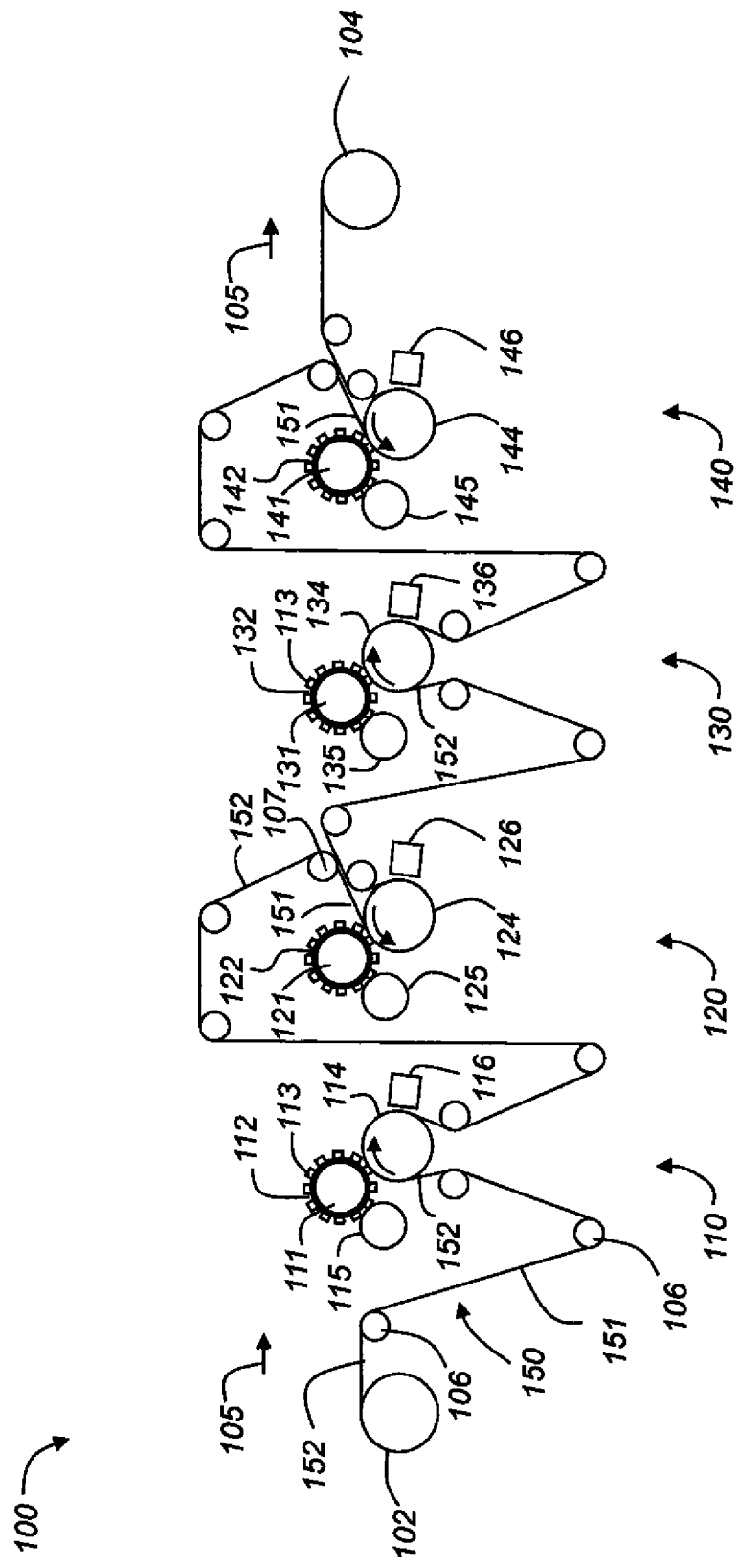
FIG. 1 is a schematic side view of a flexographic printing system useful for roll-to-roll printing (or imaging) on both sides of a substrate using the photopolymerizable composition and method of the present invention.

The following discussion is directed to various embodiments of the present invention and while some embodiments can be preferred for specific uses, the disclosed embodiments should not be interpreted or otherwise considered to be limiting the scope of the present invention, as claimed below. In addition, one skilled in the art will understand that the following disclosure has broader application than is explicitly described and the discussion of any embodiment is not intended to limit the scope of the present invention to any described embodiment.

DEFINITIONS

As used herein to define various components of the photopolymerizable composition, unless otherwise indicated, the singular forms "a", "an", and "the" are intended to include one or more of the components (that is, including plurality referents).

The terms "epoxy monomer", "unsaturated monomer," "functional oligomer," "metal particles", and "crosslinking agent" are used herein with their usual meanings and are well understood by those having ordinary skill in the art.

Each term that is not otherwise explicitly defined in the present application is to be understood to have a meaning that is commonly accepted by those skilled in the art. If the construction of a term would render it meaningless or essentially meaningless in its context, the term definition should be taken from an English language or chemical dictionary.

The use of numerical values in the various ranges specified herein, unless otherwise expressly indicated otherwise, are considered to be approximations as though the minimum and maximum values within the stated ranges were both preceded by the word "about". In this manner, slight variations above and below the stated ranges can be used to achieve substantially the same results as the values within the ranges. In addition, the disclosure of these ranges is intended as a continuous range including every value between the minimum and maximum values.

As used herein, all molecular weights are weight average molecular weights that can be determined using known procedures and equipment if the values are not already known from the literature.

Unless otherwise indicated, the term "photoinitiator composition" used in this application will refer to combinations of onium salt and an electron donor photosensitizer, which combinations are used included in the polymerizable compositions of the present invention.

Unless otherwise indicated, the term "photopolymerizable composition" refers to embodiments of the chemical compositions of the present invention, which chemical compositions are useful in the practice of the various methods of the present invention and can be provided in the articles in the present invention.

The term "polymerization" is used herein to mean the combining, for example by covalent bonding, of a large number of smaller molecules, such as monomers, to form very large molecules, that is, macromolecules or polymers. The monomers can be combined to form only linear macromolecules or they can be combined to form three-dimensional macromolecules that are commonly referred to as crosslinked polymers. An essential type of polymerization carried out in the practice of this invention is acid-catalyzed (cationic) polymerization, but free radical polymerization can also occur in the photopolymerizable compositions of this invention if optional free radically polymerizable materials and suitable free radical generating photoinitiators are also present. In many useful embodiments of the present invention, both acid-catalyzed polymerization and free radically polymerization can occur simultaneously in carrying out the present invention.

As used herein, the terms "curing" and "photocuring" mean the polymerization of functional oligomers and monomers, or even polymers, into a crosslinked polymer network. Curing can be polymerization of unsaturated monomers or oligomers in the presence of crosslinking agents.

The terms "photocurable" and "curable" are used to define a material (such as an epoxy material) that will polymerize when irradiated with suitable radiation, for example irradiated with radiation such as ultraviolet (UV), visible, or infrared radiation in the presence of an appropriate photoinitiator composition.

Average dry thickness of layers described herein can be the average of at least 10 separate measurements taken, for example, using electron microscopy.

Similarly, the average dry thickness or width of lines, grid lines, or other pattern features described herein can be the average of at least 10 separate measurements taken, for example, using electron microscopy.

The term "polymerizable epoxy material" is meant to include any material or compound having one or more oxirane rings that are capable of undergoing polymerization. This term encompasses epoxy-containing monomers, epoxy-containing oligomers, and epoxy-containing crosslinking agents. The singular form of the term is intended to include the plural form of the term. Oligomeric and multifunctional epoxy materials are also useful polymerizable epoxy materials.

The term "electron donor photosensitizer" is meant to refer to a light absorbing compound used to induce photocuring. Upon photoexcitation, the electron donor photosensitizer leads to one-electron reduction of the onium salt.

The term "photoinitiator" is meant to refer to an "onium salt" or an "onium compound" or other photoacid generator that is capable of accepting an electron from an excited electron donor photosensitizer, a process that leads to fragmentation of the onium salt to provide a Brönsted acid that initiates polymerization of the epoxy material.

"Actinic radiation" is used to refer to any electromagnetic radiation that is capable of producing photochemical or photopolymerization action in accordance with the present invention and that has a wavelength of at least 150 nm and up to and including 1250 nm, and typically at least 190 nm and up to and including 750 nm, or even at least 190 nm and up to and including 700 nm. The term "exposing radiation" also refers to such actinic radiation.

The term "visible light" is used herein to refer to electromagnetic radiation having a wavelength ($\lambda_{max}$) of greater than 400 nm to and up to and including 800 nanometers (nm).

The term "UV light" is used herein to refer to electromagnetic radiation having a wavelength ($\lambda_{max}$) of at least 150 nm and up to and including 450 nm.

Uses

The photopolymerizable compositions can be used for a variety of purposes where efficient photopolymerization is needed in various articles or devices. Such compositions must be sensitive to a chosen radiation wavelength as noted above. For example, the photopolymerizable compositions can be used to provide conductive metal patterns, for example using electroless plating procedures that can be incorporated into various devices including but not limited to touch screen or other display devices that can be used in numerous industrial and commercial products.

For example, touch screen technology can comprise different touch sensor configurations including capacitive and resistive touch sensors. Resistive touch sensors comprise several layers that face each other with a gap between adjacent layers that may be preserved by spacers formed during manufacturing. A resistive touch screen panel can comprise several layers including two thin, metallic, electrically conductive layers separated by a gap that can be created by spacers. When an object such as a stylus, palm, or fingertip presses down on a point on the panel's outer surface, the two metallic layers come into contact and a connection is formed that causes a change in the electrical current. This touch event is sent to a controller for further processing.

Capacitive touch sensors can be used in electronic devices with touch-sensitive features. These electronic devices can include but are not limited to, televisions, monitors, and projectors that can be adapted to display images including text, graphics, video images, movies, still images, and presentations. The image devices that can be used for these display devices that can include cathode ray tubes (CRS's), projectors, flat panel liquid crystal displays (LCD's), LED systems, OLED systems, plasma systems, electroluminescent displays (ECD's), and field emission displays (FED's). For example, the present invention can be used to prepare capacitive touch sensors that can be incorporated into electronic devices with touch-sensitive features to provide computing devices, computer displays, portable media players including e-readers, mobile telephones and other communicating devices.

Systems and methods of fabricating flexible and optically compliant touch sensors in a high-volume roll-to-roll manufacturing process where micro electrically conductive features can be created in a single pass are possible using the present invention. The photopolymerizable compositions can be used in such systems and methods with multiple printing members such as multiple flexographic printing plates to form multiple high resolution conductive images from predetermined designs of patterns provided in those multiple printing members. Multiple patterns can be printed on one or both sides of a substrate as described in more details below. For example, one predetermined pattern can be printed on one side of the substrate and a different predetermined pattern can be printed on the opposing side of the substrate. The printed patterns of the photopolymerizable compositions can then be further processed to provide conductive metal patterns such as for example using electroless metal plating.

The photopolymerizable compositions of the present invention provide a very useful combination of photocuring (photopolymerization) speed, cure depth (within layers or lines), and shelf life. Photopolymerization is possible even when the photopolymerizable compositions contains large amounts of the metal particles, and they can be used in a variety of technologies such as graphic arts imaging (for example, color proofing systems, photocurable inks for ink jetting, or other imaging processes), electronic conformal coatings, coated abrasives, magnetic media, and photocurable composites, as well as the electroless plating processes described herein.

Photopolymerizable Compositions

In general, the photopolymerizable compositions are sensitive throughout the UV to visible spectral region as described above and are photocurable in these electromagnetic regions without appreciable application of heat. Thus, photocuring or photopolymerization can occur at essentially room temperature (for example, as low as 18° C.) when all of the components are properly mixed together. Photopolymerization [both acid catalysis and free radical polymerization if components d) and e) are present] then readily takes place upon suitable exposure to a source of suitable radiation.

The photopolymerizable compositions are designed to be effective when they comprise the four essential components (a) through (d) described herein, which are the only components necessary to achieve the desired efficient photopolymerization. Optional addenda can also be included as described below. In some embodiments, the photopolymerizable compositions of this invention consist essentially of the four components (a) through (d).

Suitable combinations of electron donor photosensitizers and acid generators such as onium salts can be designed according to the present invention to desirably increase the speed or efficiency of photocuring or the resulting image density upon exposure to radiation of a desired wavelength. For example, the acid generator can produce an acid upon suitable exposure, and the produced acid reacts with epoxy groups in the photopolymerizable epoxy material to thus cause ring-opening polymerization such that the photopolymerizable epoxy material is crosslinked, thereby providing desired mechanical properties such as tensile strength, elasticity, and density.

Then the photopolymerizable further includes free radically polymerizable functionality, a free radical photoinitiator is generally also present to provide further crosslinking during exposure and the resulting crosslinked matrix can constitute an interpenetrating polymer network (IPN) including the crosslinked photopolymerizable epoxy material. This increased crosslinking density can further increase chemical resistance and hardness and provide superior properties for the eventual conductive metal patterns.

To determine appropriate combinations of electron donor photosensitizer and acid generator such as an onium salt to be used in present invention, the electron donor photosensitizer should be capable of transferring an electron to the acid generator upon absorption of light. There are three controlling parameters in reaction energetics: (1) the excitation energy ($E_S^*$); (2) the oxidation potential ($E_S^{OX}$) of the electron donor photosensitizer (S); and (3) the reduction potential ($E_{ON}^{red}$) of the onium salt (or other acid generator). For a photoinduced electron transfer to be feasible the relationship given in Equation 1 below must be satisfied, where ($E_S^*$) is the excitation energy of the electron donor photosensitizer molecule, and A ranges approximately between 0 and 0.3 eV.

$$E_s^* \geq E_S^{OX} - E_{ON}^{red} + \Delta \quad \text{(Equation 1)}$$

Thus, according to Equation 1, electron donor photosensitizers having excitation energy equal to or larger than the difference between the oxidation potential of the electron donor photosensitizer and the reduction potential of the onium salt (or other acid generator) will satisfy the energetic requirements of photoinitiating the reaction.

The excitation energy of the electron donor photosensitizer (S) can be determined from the midpoint of the normalized absorption and emission spectra of S if the reaction proceeds from the singlet excited state. However, if the reaction proceeds via the triplet state, the triplet energy of S should be used as the excitation energy.

With these electrochemical and photochemical fundamentals in mind, one skilled in the art can readily determine suitable materials for components (a) through (d) to be used in the photopolymerizable composition of the present invention.

(a) Photopolymerizable Epoxy Materials

The cationically polymerizable epoxy materials ("epoxies") useful in the present invention are organic compounds having at least one oxirane ring, which oxirane ring is shown in the following formula:

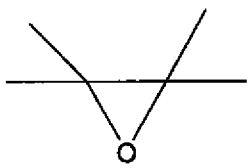

that is polymerizable by a ring opening mechanism. Such epoxy materials, also called "epoxides", include monomeric epoxy compounds and epoxides of the polymeric type and can be aliphatic, cycloaliphatic, aromatic or heterocyclic.

These materials generally have, on the average, at least one polymerizable epoxy group per molecule, or typically at least about 1.5 and even at least about 2 polymerizable epoxy groups per molecule. Polymeric epoxy materials include linear polymers having terminal epoxy groups (for example, a diglycidyl ether of a polyoxyalkylene glycol), polymers having skeletal (backbone) oxirane units (for example, polybutadiene polyepoxide), and polymers having pendant epoxy groups (for example, a glycidyl methacrylate polymer or copolymer).

The polymerizable epoxy materials can be single compounds or they can be mixtures of different epoxy materials containing one, two, or more epoxy groups per molecule. The "average" number of epoxy groups per molecule is determined by dividing the total number of epoxy groups in the epoxy material by the total number of epoxy-containing molecules present.

The epoxy materials can vary from low molecular weight monomeric materials to high molecular weight polymers and they can vary greatly in the nature of the backbone and substituent (or pendant) groups. For example, the backbone can be of any type and substituent groups thereon can be any group that does not substantially interfere with cationic photocuring process desired at room temperature. Illustrative of permissible substituent groups include but are not limited to, halogens, ester groups, ethers, sulfonate groups, siloxane groups, nitro groups, and phosphate groups. The molecular weight of the epoxy materials can be at least 58 and up to and including 100,000, or even higher.

Useful epoxy materials include those that contain cyclohexene oxide groups such as epoxycyclohexane carboxylates, such as 3,4-epoxycyclohexylmethyl-3,4-epoxycyclohexane carboxylate, 3,4-epoxy-2-methylcyclohexylmethyl-3,4-epoxy-2-methylcyclohexane carboxylate, and bis(3,4-epoxy-6-methylcyclohexylmethyl) adipate. A more detailed list of useful epoxy materials of this nature is provided in U.S. Pat. No. 3,117,099 (Proops et al.).

Still other useful epoxy materials include glycidyl ether monomers that are glycidyl ethers of polyhydric phenols obtained by reacting a polyhydric phenol with an excess of a chlorohydrin such as epichlorohydrin [for example, the diglycidyl ether of 2,2-bis-(2,3-epoxypropoxyphenol)-propane]. Further examples of epoxy materials of this type are described in U.S. Pat. No. 3,018,262 (Schroeder) and in "Handbook of Epoxy Resins" by Lee and Neville, McGraw-Hill Book Co., New York (1967).

Many commercially available epoxy materials are useful in the present invention, glycidyl ethers such as bisphenol-A-diglycidyl ether (DGEBA), glycidyl ethers of bisphenol S and bisphenol F, butanediol diglycidyl ether, bisphenol-A-extended glycidyl ethers, phenol-formaldehyde glycidyl ethers (epoxy novolacs) and cresol-formaldehyde glycidyl ethers (epoxy cresol novolacs), epoxidized alkenes such as 1,2-epoxyoctane, 1,2,13,14-tetradecane diepoxide, 1,2,7,8-octane diepoxide, octadecylene oxide, epichlorohydrin, styrene oxide, vinyl cyclohexene oxicyclohexene oxide, glycidol, glycidyl methacrylate, diglycidyl ether of Bisphenol A (for example, those available under the EPON trademark such as Epon™ 828, Epon™ 825, Epon™ 1004, and Epon™ 1010 from Momentive, DER-331, DER-332, and DER-334 resins from Dow Chemical Co.), vinyl cyclohexene dioxide (for example, ERL-4206 resin from Polyscience), 3,4-epoxycyclohexylmethyl-3,4-epoxycyclohexene carboxylate (for example, ERL-4221, UVR 6110, or UVR 6105 resin from Dow Chemical Company), 3,4-epoxy-6-methylcyclohexyl-methyl-3,4-epoxy-6-methyl-cyclohexene carboxylate (from Pfalz and Bauer), bis(3,4-epoxy-6-methylcyclohexylmethyl) adipate, bis(2,3-epoxy-cyclopentyl) ether, aliphatic epoxy modified with polypropylene glycol, dipentene dioxide, epoxidized polybutadiene (for example, Oxiron 2001 resin from FMC Corp.), silicone resin containing epoxy functionality, flame retardant epoxy resins (for example, DER-580 resin, a brominated bisphenol type epoxy resin available from Dow Chemical Co.), 1,4-butanediol diglycidyl ether of phenol formaldehyde novolak (for example, DEN-431 and DEN-438 resins from Dow Chemical Co.), resorcinol diglycidyl ether (for example, CYRACURE™ resin from Dow Corning Corp.), 2-(3,4-epoxycyclohexyl-5,5-spiro-3,4-epoxy)cyclohexane-meta-dioxane, 2-(3,4-epoxycyclohexyl-5,5-spiro-3,4-epoxy)cyclohexane-meta-dioxane, vinyl cyclohexene monoxide, 1,2-epoxyhexadecane (for example, CYRACURE™ resin from Dow Corning Corp.), alkyl glycidyl ethers such as HELOXY™ Modifier 7 and HELOXY™ Modifier 8 (from Momentive), butyl glycidyl ether (for example, HELOXY™ Modifier 61 from Momentive), cresyl glycidyl ether (for example, HELOXY™ Modifier 62 from Momentive), p-tert butylphenyl glycidyl ether (for example, HELOXY™ Modifier 65 from Momentive), polyfunctional glycidyl ethers such as diglycidyl ether of 1,4-butanediol (for example, HELOXY™ Modifier 67 from Momentive), diglycidyl ether of neopentyl glycol (for example, HELOXY™ Modifier 68 from Momentive), diglycidyl ether of cyclohexanedimethanol (for example, HELOXY™ Modifier 107 from Momentive), trimethylol ethane triglycidyl ether (for example, HELOXY™ Modifier 44 from Momentive), trimethylol propane triglycidyl ether (for example, HELOXY™ Modifier 48 from Momentive), polyglycidyl ether of an aliphatic polyol (for example, HELOXY™ Modifier 84 from Momentive), polyglycol diepoxide (for example, HELOXY™ Modifier 32 from Momentive), bisphenol F epoxides (for example, EPN-1138 or GY-281 resin from Huntman Advanced Materials), and 9,9-bis>4-(2,3-epoxypropoxy)-phenyl fluorenone (for example, Epon™ 1079 resin from Momentive).

Still other useful epoxy materials are resins such as copolymers derived from acrylic acid esters reacted with glycidol such as glycidyl acrylate and glycidyl methacrylate, copolymerized with one or more ethylenically unsaturated polymerizable monomers. Examples of such copolymers are poly (styrene-co-glycidyl methacrylate) (50:50 molar ratio), poly (methyl methacrylate-co-glycidyl acrylate) (50:50 molar ratio), and poly(methyl methacrylate-co-ethyl acrylate-co-glycidyl methacrylate) (62.5:24:13.5 molar ratio).

Other useful epoxy materials are epichlorohydrins such as epichlorohydrin, alkylene oxides such as propylene oxide and styrene oxide, alkenyl oxides such as butadiene oxide, and glycidyl esters such as ethyl glycidate.

Still other useful epoxy materials are silicones having an epoxy functionality or group such as cyclohexylepoxy groups, especially those epoxy materials having a silicone backbone. Commercial examples of such epoxy materials include UV 9300, UV 9315, UV 9400, UV 9425 silicone materials that are available from Momentive.

Polymeric epoxy materials can optionally contain other functionalities that do not substantially interfere with cationic photocuring of the photopolymerizable composition at room temperature. For example, the photopolymerizable epoxy materials can also include free-radically polymerizable functionality.

The photopolymerizable epoxy material can comprise a blend or mixture of two or more different epoxy materials. Examples of such blends include two or more molecular weight distributions of photopolymerizable epoxy materials, such as a blend of one or more low molecular weight (below 200) epoxy materials with one or more intermediate molecular weight (from 200 to 10,000) photopolymerizable epoxy materials, or one or more of such photopolymerizable epoxy materials with one or more higher molecular weight (above about 10,000) epoxy materials. Alternatively or additionally, the photopolymerizable epoxy material can comprise a blend of epoxy materials having different chemical natures, such as aliphatic and aromatic natures, or different functionalities, such as polar and non-polar properties. Other cationically polymerizable monomers or polymers can additionally be incorporated into the photopolymerizable epoxy material.

As noted above, many useful photopolymerizable epoxy materials are commercially available from various sources, and others can be readily prepared using known synthetic methods and conditions as well as known starting materials.

The photopolymerizable epoxy materials can be used to provide binder function if desired for given utilities. Otherwise, non-photocurable polymers or resins can be included for this purpose if needed. Alternatively, the photocurable acrylates described below can be used to provide a binder function.

One or more photopolymerizable epoxy materials are included in the photopolymerizable composition in a suitable amount to provide the desired efficient photocuring or photopolymerization. For example, the one or more photopolymerizable epoxy materials are present in an amount of at least 10 weight % and up to and including 95 weight %, or typically of at least 50 weight % and up to and including 75 weight %, based on the total weight of all four (a) through (d) components in the photopolymerizable composition.

(b) Photoacid Generators

Various compounds can be used to generate a suitable acid to participate in the photocuring of the photopolymerizable composition described herein. Some of these "photoacid generators" are acidic in nature and others are nonionic in nature. Other useful photoacid generators besides those described below would be readily apparent to one skilled in the art in view of the teaching provided herein. The various compounds useful as photoacid generators can be purchased from various commercial sources or prepared using known synthetic methods and starting materials.

(i) Onium Salts

Onium salt acid generators useful in the practice of this invention include but are not limited to, salts of diazonium, phosphonium, iodonium, or sulfonium salts including polyaryl diazonium, phosphonium, iodonium, and sulfonium salts. The iodonium or sulfonium salts include but not limited to, diaryliodonium and triarylsulfonium salts. Useful counter anions include but are not limited to complex metal halides, such as tetrafluoroborate, hexafluoroantimonate, trifluoromethanesulfonate, hexafluoroarsenate, hexafluorophosphate, and arenesulfonate. The onium salts can also be oligomeric or polymeric compounds having multiple onium salt moieties as well as molecules having a single onium salt moiety.

Examples of useful aromatic iodonium salts include but are not limited to, diphenyliodonium tetrafluoroborate; di(4-methylphenyl)iodonium tetrafluoroborate; phenyl-4-methylphenyliodonium tetrafluoroborate; di(4-heptylphenyl)iodonium tetrafluoroborate; di(3-nitrophenyl)iodonium hexafluorophosphate; di(4-chlorophenyl)iodonium hexafluorophosphate; di(naphthyl)iodonium tetrafluoroborate; di(4-trifluoromethylphenyl)iodonium tetrafluoroborate; diphenyliodonium hexafluorophosphate; di(4-methylphenyl) iodonium hexafluorophosphate; diphenyliodonium hexafluoroarsenate; di(4-phenoxyphenyl)iodonium tetrafluoroborate; phenyl-2-thienyliodonium hexafluorophosphate; 3,5-dimethylpyrazolyl-4-phenyliodonium hexafluorophosphate; diphenyliodonium hexafluoroantimonate; 2,2'-diphenyliodonium tetrafluoroborate; di(2,4-dichlorophenyl) iodonium hexafluorophosphate; di(4-bromophenyl) iodonium hexafluorophosphate; di(4-methoxyphenyl) iodonium hexafluorophosphate; di(3-carboxyphenyl) iodonium hexafluorophosphate; di(3-methoxycarbonylphenyl)iodonium hexafluorophosphate; di(3-methoxysulfonylphenyl)iodonium hexafluorophosphate; di(4-acetamidophenyl)iodonium hexafluorophosphate; di(2-benzothienyl)iodonium hexafluorophosphate; and diphenyliodonium hexafluoroantimonate; and mixtures thereof. Such compounds can be prepared by metathesis of corresponding aromatic iodonium simple salts (such as, for example, diphenyliodonium bisulfate) in accordance with the teachings of Beringer et al., *J. Am. Chem. Soc.* 81, 342 (1959).

Other suitable iodonium salts include those described in U.S. Pat. No. 5,545,676 (Palazzotto et al.) at column 2 (lines 28 through 46), as well as those described in U.S. Pat. No. 3,729,313 (Smith), U.S. Pat. No. 3,741,769 (Smith), U.S. Pat. No. 3,808,006 (Smith), U.S. Pat. No. 4,250,053 (Smith) and U.S. Pat. No. 4,394,403 (Smith).

Useful iodonium salts can be simple salts (for example, containing an anion such as chloride, bromide, iodide, or $C_4H_5SO_3^-$) or a metal complex salt (for example, containing $SbF_6^-$, $PF_6^-$, $BF_4^-$, tetrakis(perfluorophenyl)borate, or $SbF_5OH_{31}$ $AsF_6^-$). Mixtures of any of these iodonium salts of the same or different class can be used if desired.

Exemplary sulfonium salts include but are not limited to, triphenylsulfonium tetrafluoroborate, methyldiphenylsulfonium tetrafluoroborate, dimethylphenylsulfonium hexafluorophosphate, triphenylsulfonium hexafluorophosphate, triphenylsulfonium hexafluoroantimonate, diphenylnaphthylsulfonium hexafluoroarsenate, tritolylsulfonium hexafluorophosphate, anisyldiphenylsulfonium hexafluoroantimonate, 4-butoxyphenyldiphenylsulfonium tetrafluoroborate, 4-chlorophenyldiphenyl-sulfonium hexafluorophosphate, tri(4-phenoxyphenyl)sulfonium hexafluorophosphate, di(4-ethoxyphenyl)methylsulfonium hexafluoroarsenate, 4-acetonylphenyldiphenylsulfonium tetrafluoroborate, 4-thiomethoxyphenyl-diphenylsulfonium hexafluorophosphate, di(methoxysulfonylphenyl)methylsulfonium hexafluoroantimonate, di(nitrophenyl)phenylsulfonium hexafluoroantimonate, di(carbomethoxyphenyl)methylsulfonium hexafluorophosphate, 4-acetamidophenyldiphenylsulfonium tetrafluoroborate, dimethylnaphthylsulfonium hexafluorophosphate, trifluoromethyldiphenyl-sulfonium tetrafluoroborate, p-(phenylthiophenyl)diphenylsulfonium hexafluoroantimonate, p-(phenylthiophenyl)diphenylsulfonium hexafluorophosphate, di-[p-(phenylthiophenyl)]phenylsulfonium hexafluoroantimonate, di-[p-(phenylthiophenyl)]phenylsulfonium hexafluorophosphate, 4,4'-bis(diphenylsulfonium) diphenylsulfide bis(hexafluoroantimonate), 4,4'-bis(diphenylsulfonium)diphenylsulfide bis(hexafluorophosphate), 10-methylphenoxathiinium hexafluorophosphate 5-methylthianthrenium hexafluorophosphate, 10-phenyl-9,9-dimethylthioxanthenium hexafluorophosphate, 10-phenyl-9-oxothioxanthenium tetrafluoroborate, 5-methyl-10-oxothianthrenium tetrafluoroborate, 5-methyl-10,10-dioxothianthrenium hexafluorophosphate, and mixtures thereof.

Sulfonium salts are desirable for use and should be soluble in any inert organic solvents (described below) and they should also be shelf-stable, meaning they do not spontaneously promote polymerization when mixed with the other components especially the electron acceptor photosensitizer and electron donor co-initiator prior to exposure to suitable radiation. Accordingly, selection of a particular onium salt can be made for optimum properties with the other essential components and amounts.

Particularly useful sulfonium salts include but are not limited to, triaryl-substituted salts such as mixed triarylsulfonium hexafluoroantimonates (for example, commercially available as UVI-6974 from Dow Chemical Company), mixed triarylsulfonium hexafluorophosphates (for example, commercially available as UVI-6990 from Dow Chemical Company), and arylsulfonium hexafluorophosphates (for example, commercially available as SarCat™ KI85 from Sartomer Company).

As noted above, many useful onium salts can be obtained from various commercial sources, and others can be prepared using known starting materials and synthetic methods.

One or more onium salts (such as an iodonium salt or a sulfonium salt) are generally present in the photopolymerizable composition in an amount of at least 0.05 weight % and up to and including 10 weight %, or typically at least 0.1 weight % and up to and including 10 weight %, or even at least 0.5 weight % and up to and including 5 weight %, based on the total weight of the all five (a) through (e) components [or the total weight of all seven (a) through (g) components if all are present] of the photopolymerizable composition.

(ii) Nonionic Photoacid Generators

Besides onium salts described above, nonionic photoacid generators are also useful in present invention, which include but are not limited to, diazomethane derivatives such as, for example, bis(benzenesulfonyl)-diazomethane, bis(p-toluenesulfonyl)diazomethane, bis(xylenesulfonyl)-diazomethane, bis(cyclohexylsulfonyl)-diazomethane, bis(cyclopentylsulfonyl) diazomethane, bis(n-butylsulfonyl) diazomethane, bis(iso-butylsulfonyl)-diazomethane, bis(sec-butylsulfonyl)diazomethane, bis(n-propylsulfonyl) diazomethane, bis(iso-propylsulfonyl)-diazomethane, bis(tert-butylsulfonyl) diazomethane, bis(n-amylsulfonyl)diazomethane, bis(isoamylsulfonyl)-diazomethane, bis(sec-amylsulfonyl)diazomethane, bis(tert-amylsulfonyl) diazomethane, 1-cyclohexylsulfonyl-1-(tert-butyl sulfonyl) diazomethane, 1-cyclohexylsulfonyl-1-(tert-amylsulfonyl) diazomethane, and 1-tert-amylsulfonyl-1-(tert-butyl sulfonyl)diazomethane.

Nonionic photoacid generators can also include glyoxime derivatives such as, for example, bis-o-(p-toluenesulfonyl)-α-dimethylglyoxime, bis-o-(p-toluenesulfonyl)-α-diphenylglyoxime, bis-o-(p-toluenesulfonyl)-α-dicyclohexyl-glyoxime, bis-o-(p-toluenesulfonyl)-2,3-pentanedioneglyoxime, bis-o-(p-toluenesulfonyl)-2-methyl-3,4-pentane-dioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(t-butanesulfonyl)-α-dimethylglyoxime, bis-o-(perfluorooctanesulfonyl)-α-dimethylglyoxime, bis-o-(cyclohexane-sulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-t-butylbenzenesulfonyl)-α-dimethylglyoxime, bis-o-(xylenesulfonyl)-α-dimethylglyoxime, or bis-o-(camphorsulfonyl)-α-dimethylglyoxime.

Such photoacid generators further include bissulfone derivatives such as, for example, bisnaphthylsulfonylmethane, bistrifluoromethylsulfonylmethane, bismethylsulfonylmethane, bisethylsulfonylmethane, bispropylsulfonylmethane, bisisopropyl-sulfonylmethane, bis-p-toluenesulfonylmethane, bisbenzenesulfonylmethane, 2-cyclohexyl-carbonyl-2-(p-toluenesulfonyl)propane (β-ketosulfone derivative), and 2-isopropyl-carbonyl-2-(p-toluenesulfonyl)propane (β-ketosulfone derivative).

Other classes of useful nonionic photoacid generators include disulfono derivatives such as, for example, diphenyl disulfone and dicyclohexyl disulfone; nitrobenzyl sulfonate derivatives such as, for example, 2,6-dinitrobenzyl p-toluenesulfonate and 2,4-dinitrobenzyl p-toluenesulfonate; sulfonic acid ester derivatives such as, for example, 1,2,3-tris(methanesulfonyl-oxy)benzene, 1,2,3-tris(trifluoro-methanesulfonyloxy)benzene, and 1,2,3-tris(p-toluenesulfonyloxy)benzene; and sulfonic acid esters of N-hydroxyimides such as, for example, N-hydroxysuccinimide methanesulfonate, N-hydroxy-succinimide trifluoromethanesulfonate, N-hydroxysuccinimide ethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide 1-octanesulfonate, N-hydroxysuccinimide p-toluenesulfonate, N-hydroxysuccinimide p-methoxybenzenesulfonate, N-hydroxysuccinimide 2-chloroethanesulfonate, N-hydroxysuccinimide benzenesulfonate, N-hydroxysuccinimide 2,4,6-trifluoro-benzenesulfonate, N-hydroxysuccinimide 2,4,6-trimethyl-benzenesulfonate, N-hydroxysuccinimide 2,4,6-trichloro-benzenesulfonate, N-hydroxysuccinimide 4-cyano-benzenesulfonate, N-hydroxysuccinimide 1-naphthalenesulfonate, N-hydroxysuccinimide 2-naphthalenesulfonate, N-hydroxy-2-phenylsuccinimide methanesulfonate, N-hydroxymaleimide methanesulfonate, N-hydroxymaleimide ethanesulfonate, N-hydroxy-2-phenylmaleimide methanesulfonate, N-hydroxyglutarimide methanesulfonate, N-hydroxyglutarimide benzenesulfonate, N-hydroxyphthalimide methanesulfonate, N-hydroxyphthalimide benzenesulfonate, N-hydroxyphthalimide trifluoromethanesulfonate, N-hydroxyphthalimide p-toluenesulfonate, N-hydroxynaphthalimide methanesulfonate, N-hydroxynaphthalimide benzenesulfonate, N-hydroxy-5-norbornene-2,3-dicarboxylmide methanesulfonate, N-hydroxy-5-norbornene-2,3-dicarboxylmide trifluoromethanesulfonate, N-hydroxy-5-norbornene-2,3-dicarboxylmide p-toluenesulfonate, N-hydroxynaphthalimide triflate, and N-hydroxy-5-norbornene-2,3-dicarboximide perfluoro-1-butanesulfonate.

One or more nonionic photoacid generators can be present in the photopolymerizable composition in an amount of at least 0.05 weight % and up to and including 10 weight %, or typically at least 0.1 weight % and up to and including 10 weight %, or even at least 0.5 weight % and up to and including 5 weight %, based on the total weight of the all five (a) through (e) components [or the total weight of all seven (a) through (g) components if all are present] of the photopolymerizable composition.

(c) Electron Donor Photosensitizers

Useful electron donor photosensitizers should be soluble in the photopolymerizable composition, free of functionalities that would substantially interfere with the cationic photocuring process, and capable of light absorption (sensitivity) within the range of wavelengths of at least 150 nm and up to and including 1000 nm.

Suitable electron donor photosensitizers initiate the chemical transformation of the onium salt (or other photoacid generator) in response to the photons absorbed from the irradiation. The electron donor photosensitizer should also be capable of reduce the photoacid generator after the electron donor photosensitizer has absorbed light (that is, photoinduced electron transfer). Thus, the electron donor photosensitizer, upon absorption of photons from irradiation, is generally capable of donating an electron to the photoacid generator.

For uses of the photopolymerizable compositions in which very rapid curing (such as the curing of thin applied films of the compositions) is desired, the electron donor photosensitizers can have an extinction coefficient of at least 1000 liter-mole$^{-1}$ cm$^{-1}$ and typically at least 50,000 liters-mole$^{-1}$ cm$^{-1}$ at the desired irradiation wavelength using the photocuring process.

For example, each of the electron donor photosensitizers generally has an oxidation potential of at least 0.4 V and up to and including 3 V vs. SCE, or more typically of at least 0.8 V and up to and including 2 V vs. SCE.

In general, many different classes of compounds can be used as electron donor photosensitizers for various reactants, provided that the energetic requirements discussed above in Equation 1 are satisfied. Useful electron donor photosensitizers include but are not limited to, aromatics such as naphthalene, 1-methylnaphthalene, anthracene, 9,10-dimethoxyanthracene, benz[a]anthracene, pyrene, phenanthrene, benzo[c]phenanthrene, and fluoranthene.

Other useful electron donor photosensitizers that involve the triplet excited state are carbonyl compounds such as thioxanthones and xanthones. Ketones including aromatic ketones such as fluorenone, and coumarin dyes such as ketocoumarins such as those with strong electron donating moieties (such as dilakylamino) can also be used as electron donor photosensitizers. Other suitable electron donor photosensitizers are believed to include xanthene dyes, acridine dyes, thiazole dyes, thiazine dyes, oxazine dyes, azine dyes, aminoketone dyes, porphyrins, aromatic polycyclic hydrocarbons, p-substituted aminostyryl ketone compounds, aminotriarylmethanes, merocyanines, squarylium dyes, and pyridinium dyes.

It is also possible to use a mixture of electron donor photosensitizers that are chosen from the same or different classes of materials.

Examples of useful electron donor photosensitizers include but are not limited to, compounds S-1 through S-12 listed in the following TABLE I.

TABLE I

| Compound | |
| --- | --- |
| S-1 | (1,4-dimethylnaphthalene structure) |
| S-2 | (9,10-dimethylanthracene structure) |
| S-3 | (9,10-dimethoxyanthracene structure) |
| S-4 | (4,4'-bis(dimethylamino)benzophenone structure) |
| S-5 | (2,4-diisopropylthioxanthone structure) |
| S-6 | (xanthone structure) |
| S-7 | (coronene structure) |
| S-8 | (pyrene structure) |
| S-9 | (benzo[a]pyrene structure) |

TABLE I-continued

| | Compound |
|---|---|
| S-10 | (phenothiazine structure) |
| S-11 | (phenoxazine structure) |
| S-12 | (dibenz[a,h]anthracene structure) |

Various useful electron donor photosensitizers are available from various commercial sources and can be readily found for use in the present invention.

The one or more electron donor photosensitizers can be present in the photopolymerizable composition in an amount of at least 0.0001 weight % and up to and including 5 weight %, and typically at least 0.001 weight % and up to and including 2 weight %, based on the total weight of components (a) through (d) in the photopolymerizable composition. Exact amounts of required electron donor photosensitizers depend on overall photopolymerizable composition, application, and the extinction coefficient. Generally, if the extinction coefficient of the electron donor photosensitizer is high, which corresponds to higher light absorption efficiency, smaller amounts are required.

In some embodiments, the electron donor photosensitizer is a pyrene, benzopyrene, perylene, or benzoperylene that is present in an amount of at least 0.05 weight % and up to and including 2 weight %, based on the total weight of components (a), (b), and (d).

(d) Metal Particles

Metal particles are present in the photopolymerizable composition. Usually only one type of metal particles are used, but it is also possible to include mixtures of metal particles, from the same or different classes of metals, that do not interfere with each other. These metal particles have a net neutral charge.

Useful metal particles can be chosen from one or more classes of noble metals, semi-noble metals, Group IV metals, or combinations thereof. Useful noble metal particles include but are not limited to, particles of gold, silver, palladium, platinum, rhodium, iridium, rhenium, mercury, ruthenium, and osmium. Useful particles of semi-noble metals include but are not limited to, particles of iron, cobalt, nickel, copper, carbon, aluminum, zinc, and tungsten. Useful particles of Group IV metals include but are not limited to particles of tin, titanium, and germanium. The noble metal particles such as particles of silver, palladium, and platinum are particularly useful, and the semi-noble particles of nickel and copper are also particularly useful. Tin particles are particularly useful in the Group IV metal class. In many embodiments, silver or copper particles are used in the photopolymerizable composition.

The metal particles useful in the present invention can be coated isolated using surfactants, polymers, or carbon. The carbon on coated metal particles can be amorphous, sp2 hybridized, or graphene-like in nature. Such carbon can be used to prevent aggregation of metal particles and provide improved dispersibility in the photopolymerizable composition.

The metal particles can be dispersed in various organic solvents and can have improved dispersibility in the presence of the other essential components of the photopolymerizable composition, such as multifunctional polymeric epoxy materials or in the presence of optional components such as multifunctional acrylate resins described below. Other dispersants that would be known in the art can also be present if desired. The methods used to disperse the metal particles include but are not limited to, ball-milling, magnetic stirring, high speed homogenization, high pressure homogenization, and ultrasonication.

The metal particles used in the present invention can be present in the photopolymerizable composition as individual particles, but in many embodiments, the metal particles are present as agglomerations of two or more-metal particles. Such metal particles can be present in any geometric shape including but not limited to, spheres, rods, prisms, cubes, cones, pyramids, wires, flakes, platelets, and combinations thereof, and they can be uniform or non-uniform in shapes and sizes. The average particle size of individual and agglomerated metal particles can vary from at least 0.01 μm and up to and including 25 μm, or more likely of at least 0.02 μm and up to and including 5 μm. Although the size of the metal particles is not particularly limited for practice of the present invention, optimal benefits of the present invention can be achieved using metal particles as individual particles or agglomerates, having an average particle size of at least 0.02 μm and up to and including 10 μm. The particle size distribution is desirably narrow as defined as one in which greater than 50%, or typically at least 75%, of the particles have a particle size in the range of 0.2 to 2 times the average particle size. The average particle size (same as mean particle size) can be determined from the particle size distribution that can be determined using any suitable procedure and equipment including that available from Coulter or Horiba and the appropriate mathematical calculations used with that equipment.

Useful metal nanoparticles can be obtained from various commercial sources, or they can be derived from various metal salts or complexes and known reduction and isolation processes prior to use in the practice of this invention. Some commercial metal particles can be obtained for example from Novacentrix.

The metal particles are generally present in the photopolymerizable composition in an amount of at least 0.1 weight % and up to and including 50 weight % or more typically at least 1 weight % and up to and including 30 weight %, based on the total weight of components (a) through (d) in the photopolymerizable composition.

Some particularly useful embodiments of the photopolymerizable composition comprise the following features:

the photopolymerizable epoxy material has at least two polymerizable epoxy groups per molecule and is present in an amount of at least 50 weight % and up to and including 75 weight %, based on the total weight of all five (a) through (e) components, the photoacid generator such as an iodonium or sulfonium that is present in an amount of at least 0.1 weight % and up to and including 8 weight %, based on the total weight of the polymerizable epoxy material(s), the electron donor photosensitizer is an aromatic molecule, condensed aromatic molecule, heteroaromatic molecule, condensed heteroaromatic molecule, a dye, or an electron rich ketone, that has an extinction coefficient of at least 1000 1-mole$^{-1}$ cm$^{-1}$ and is present in an amount of at least 0.0001 weight % and up to and including 5 weight %, based on the total weight of components (a) through (d), and the metal particles are silver particles that are present in an amount of at least 1 weight % and up to and including 50 weight % based on the total weight of components (a) through (d).

Optional Components (e) Free Radically Polymerizable Compounds

The photopolymerizable compositions can also contain one or more free-radically polymerizable compounds to provide free-radically polymerizable functionality, including ethylenically unsaturated polymerizable monomers, oligomers, or polymers such as mono-functional or multi-functional acrylates (also includes methacrylates). Such free-radically polymerizable compounds comprise at least one ethylenically unsaturated polymerizable bond and they can comprise two or more of these unsaturated moieties in many embodiments. Suitable materials of this type contain at least one ethylenically unsaturated polymerizable bond and are capable of undergoing addition (or free radical) polymerization. Such free radically polymerizable materials include mono-, di-, or poly-acrylates and methacrylates including but not limited to, methyl acrylate, methyl methacrylate, ethyl acrylate, isopropyl methacrylate, n-hexyl acrylate, stearyl acrylate, allyl acrylate, glycerol diacrylate, glycerol triacrylate, ethylene glycol diacrylate, diethylene glycol diacrylate, triethylene glycol dimethacrylate, 1,3-propanediol diacrylate, 1,3-propanediol dimethacrylate, 1, 4-butanediol diacrylate, 1,6-hexanediol diacrylate, neopentyl glycol diacrylate, neopentyl glycol dimethacrylate, trimethylolpropane triacrylate, 1,2,4-butanetriol trimethacrylate, 1,4-cyclohexanediol diacrylate, pentaerythritol triacrylate, pentaerythritol tetraacrylate, pentaerythritol tetramethacrylate, dipentaetrythritol hexaacrylate, sorbitol hexaacrylate, bis[1-(2-acryloxy)]-p-ethoxyphenyldimethylmethane, bis[1-(3-acryloxy-2-hydroxy)]-p-propoxyphenyldimethylmethane, and tris-hydroxyethyl-isocyanurate trimethacrylate; the bis-acrylates and bis-methacrylates of polyethylene glycols having a molecular weight of from 200 to and including 500, co-polymerizable mixtures of acrylate monomers such as those described in U.S. Pat. No. 4,652,274 (Boettcher et al.) and acrylate oligomers such as those described in U.S. Pat. No. 4,642,126 (Zader et al.); and vinyl compounds such as styrene and styrene derivatives, diallyl phthalate, divinyl succinate, divinyl adipate, and divinyl phthalate. Mixtures of two or more of these free radically polymerizable materials can be used if desired.

Such materials can be purchased from a number of commercial sources or prepared using known synthetic methods and starting materials.

Although the amount of the one or more free radically polymerizable materials is not particularly limited, they can be present in the photopolymerizable compositions in an amount of at least 20 weight % and up to and including 75 weight % or typically of at least 40 weight % and up to and including 60 weight %, based on the total weight of all seven (a) through (g) components of the photopolymerizable composition and can be optimized based on the desired properties of composition solubility and mechanical strength of the photocured composition.

(f) Free Radical Photoinitiators

If the (e) component is present, one or more free radical photoinitiators are also present in the photopolymerizable compositions to generate free radicals in the presence of the free-radically polymerizable compounds. Such free radical photoinitiators include any compound that is capable of generating free radicals upon exposure to photopolymerizing radiation used in the practice of this invention such as ultraviolet or visible radiation. For example, free radical photoinitiators can be selected from triazine compounds, thioxantone compounds, benzoin compounds, carbazole compounds, diketone compounds, sulfonium borate compounds, diazo compounds, and biimidazole compounds, and others that would be readily apparent to one skilled in the art. Mixtures of such compounds can be selected from the same or different classes.

Also useful are benzophenone compounds such as benzophenone, benzoyl benzoate, methyl benzoyl benzoate, 4-phenyl benzophenone, hydroxyl benzophenone, acrylated benzophenone, 4,4'-bis(dimethylamino)benzophenone and 4,4'-bis(diethylamino)benzophenone, anthraquinone compounds, and acetophenone compounds such as 2,2'-diethoxyacetophenone, 2,2'-dibutoxyacetophenone, 2-hydroxy-2-methylpropiophenone, p-t-butyltrichloroacetophenone, p-t-butyldichloroacetophenone, benzophenone, 4-chloroacetophenone, 4,4'-dimethylaminobenzophenone, 4,4'-dichlorobenzophenone, 3,3'-dimethyl-2-methoxybenzophenone, 2,2'-dichloro-4-phenoxyacetophenone, 2-methyl-1-(4-(methylthio)phenyl)-2-morpholinopropan-1-one, and 2-benzyl-2-dimethylamino-1-(4-morpholinophenyl)-butane-1-one. Further useful compounds of this type are described for example in U.S. Pat. No. 7,875,416 (Park et al.).

Many of such free radical photoinitiators can be obtained from various commercial sources.

Such free radical photoinitiators are generally present in the photopolymerizable composition in an amount of at least 0.1 weight % and up to and including 10 weight %, or typically at least 1 weight % and up to and including 5 weight %, based on the total weight of all seven (a) through (g) components of the photopolymerizable composition.

Some particularly useful embodiments of the photopolymerizable composition comprise the following features:

the photopolymerizable epoxy material has at least two polymerizable epoxy groups per molecule and is present in an amount of at least 50 weight % and up to and including 75 weight %, based on the total weight of all seven (a) through (f) components, an onium salt photoacid generator that is an iodonium or sulfonium that is present in an amount of at least 0.1 weight % and up to and including 5 weight %, based on the total weight of all seven (a) through (f) components, the electron donor photosensitizer is present in an amount of at least 0.001 weight % and up to and including 2 weight %, based on the total weight of all seven (a) through (f) components and is a compound that has an oxidation potential of at least 0.4 V and up to and including 2 V vs. SCE and has an extinction coefficient of at least 1000 1-mole$^{-1}$ cm$^{-1}$ at the desired wavelength of photocuring, the metal particles are silver or copper particles that are present in an amount of at least 1 weight % and up to and including 50 weight % based on the total weight of all seven (a) through (f) components, the one or more free radically polymerizable compounds can be present in an amount of at least 20 weight % and up to and including 75 weight %, based on all seven (a) through (f) components, and each of the one or more free radical photoinitiators can be present in an amount of at least 0.1 weight % and up to and including 10 weight %, based on the total weight of (a) through (f) components.

It can also be advantageous that the weight ratio of the sum of the weights of components (a), (b), (c), (d), (e), and (f) to the weight of component (d) in certain photopolymerizable compositions is from 1:1 to and including 3:1, or typically from 1:1 to and including 2.5:1.

While not necessary in the practice of the present invention, it is also possible include conductive nano-oxides and conductive nano-carbon materials such as nano-tubes, nano-graphene, and bucky balls. Conductive nano-oxides include but are not limited to, indium tin oxide, antimony oxide, antimony tin oxides, indium oxide, zinc oxide, zinc aluminum oxide, and mixtures thereof.

It can be useful to include one or more hydroxy-containing materials, including polyols, in the photopolymerizable composition as charge transfer agents to aid in the photopolymerization process. The term "polyol" refers to an organic compound having two or more primary or secondary aliphatic hydroxy groups in the molecule. Each hydroxy (or hydroxyl) group in a hydroxy-containing material is directly bonded to a non-aromatic carbon atom in the molecule. When used, the hydroxy-containing materials can be in liquid or solid form and have an organic nature. Any of the hydroxyl groups can be terminally situated, or pendant from a homopolymer or copolymer backbone.

The molecular weight of useful hydroxy-containing materials can be as low as 32 and up to one million or more for the polymeric polyols. For example, some useful hydroxy-containing materials have a low molecular weight of at least 32 and up to and including 200, or an intermediate molecular weight of at least 200 and up to and including 10,000, or a higher molecular weight that is greater than 10,000.

Useful hydroxy-containing materials can optionally contain other functionalities (besides the hydroxy groups) that do not substantially interfere with cationic photopolymerization at room temperature according to the present invention. Thus, the hydroxy-containing material can be either non-aromatic in nature or contain aromatic functionality, and can contain heteroatoms in the backbone of the molecule, including but not limited to, nitrogen, oxygen, and sulfur atoms, provided that such heteroatoms do not substantially interfere with cationic photopolymerization at room temperature according to the present invention. Useful polyols can be selected naturally occurring or synthetically prepared cellulosic materials.

To be useful in the present invention, the hydroxy-containing materials are also substantially free of groups that can be thermally or photolytically unstable, that is, the hydroxy-containing materials will not decompose or liberate volatile components at temperatures below about 100° C. or in the presence of actinic light that is used during photopolymerization according to the present invention.

Representative examples of suitable hydroxy-containing materials having a single hydroxy group include but are not limited to, alkanols, monoalkyl ethers of polyoxyalkyleneglycols, monoalkyl ethers of alkylene-glycols, and other compounds that would be readily apparent to one skilled in the art.

Representative examples of useful non-polymeric (monomeric) polyhydroxy-containing materials (polyols) include but are not limited to, alkylene glycols (such as 1,2-ethanediol, 1,3-propanediol, 1,4-butanediol, 1,6-hexanediol, 1,8-octanediol, 2-ethyl-1,6-hexanediol, bis(hydroxymethyl)-cyclohexane, 1,18-dihydroxyoctadecane, and 3-chloro-1,2-propanediol), polyhydroxyalkanes (such as glycerine, tri-methylolethane, pentaerythritol, and sorbitol), N,N-bis (hydroxyethyl)benzamide, 2-butyne-1,4-diol, 4,4'-bis (hydroxymethyl)diphenylsulfone, and castor oil.

Representative examples of useful polymeric hydroxyl-containing materials (including polyols) include but are not limited to, polyoxyethylene glycol and polyoxypropylene glycol, and particularly polyoxyethylene and polyoxypropylene glycol diols and triols having molecular weights of at least 200 and up to and including 10,000 corresponding to an equivalent weight of at least 100 and up to and including 5,000 for the diols or at least 70 and up to and including 3,300 for triols; polytetramethylene ether glycols (such as polytetrahydrofuran or "poly THF") of varying molecular weight; copolymers derived from hydroxypropyl and hydroxyethyl acrylates and methacrylates with other free radical ethylenically unsaturated polymerizable monomers such as acrylate esters, vinyl halides; or styrene; copolymers containing pendent hydroxy groups formed by hydrolysis or partial hydrolysis of vinyl acetate copolymers; poly(vinyl acetal) resins containing pendent hydroxyl groups; modified cellulose polymers such hydroxyethylated and hydroxypropylated cellulose; hydroxy-terminated polyesters; hydroxy-terminated polylactones, such as polycaprolactones; fluorinated polyoxyethylene or polyoxypropylene glycols; and hydroxy-terminated polyalkadienes.

Useful commercially available hydroxy-containing materials include the Terathane® series of resins (available from Invisita) of polytetramethylene ether glycols such as Terathane® 650, 1000, 2000 and 2900 resins; PeP (available from Invisita) polyoxyalkylene tetrols having secondary hydroxyl groups such as PeP 450, 550, and 650 resins; Butvar® series (available from Monsanto Chemical Company) of poly(vinyl acetal) resins such as Butvar® B-72A, B-73, B-76, B-90, and B-98 resins; and Formvar™ 7/70, 12/85, 7/95S, 7/95E, 15/95S and 15/95E resins; the Tone series (available from Dow Chemical Company) of polycaprolactone polyols such as Tone 0200, 0210, 0230, 0240, 0300 resins; Paraplex® U-148 (available from Rohm and Haas) aliphatic polyester diol; Multron R series (available from Bayer) saturated polyester polyols such as Multron R-2, R-12A, R-16, R-18, R-38, R-68 and R-74 resins; Klucel E (available from Hercules Inc.) hydroxypropylated cellulose having an equivalent weight of approximately 100; and Alcohol Soluble Butyrate (available from Eastman Kodak Company) cellulose acetate butyrate ester having a hydroxyl equivalent weight of approximately 400; polyether polyols such as polypropylene glycol diols (for example, Arcol® PPG-425, Arcol® PPG-725, Arcol® PPG-1025, Arcol® PPG-2025, Arcol® PPG-3025, and Arcol® PPG-4025 resins from ARCO Chemical Co.); polypropylene glycol triols (such as Arcol® LT-28, Arcol® LHT-42, Arcol® LHT 112, Arcol® LHT 240, Arcol® LG-56, Arcol® LG-168, and Arcol® LG-650 resins from Bayer); ethylene oxide capped polyoxypropylene triol or diol (such as Arcol® 11-27, Arcol® 11-34, Arcol® E-351, Arcol® E-452, Arcol® E-785, and Arcol® E-786 resins from Bayer); ethoxylated bis-phenol A; and propylene oxide or ethylene oxide-based polyols (such as Voranol™ polyether polyols including Voranol™ 230-056, Voranol™ 220 series, Voranol™ 230 series, and Voranol™ 240 resins from the Dow Chemical Co.).

Blends of various hydroxy-containing materials are also contemplated for this invention. Examples of such blends can include two or more molecular weight distributions of hydroxyl-containing compounds, such as low molecular weight (below 200), intermediate molecular weight (about 200 to 10,000) and higher molecular weight (above about 10,000) materials. Alternatively or additionally, the hydroxy-containing materials can contain a blend of hydroxy-containing materials having different chemical natures, such as blends of aliphatic and aromatic compounds, or blends of materials with different functionality, such as blends of polar and non-polar hydroxy-containing materials. Additional embodiments can include mixtures of two or more poly-functional hydroxy-containing materials or one or more mono-functional hydroxy-containing materials with one or more poly-functional hydroxy-containing materials.

The amount of hydroxy-containing material that can be present in the photopolymerizable compositions can vary over broad ranges, depending upon factors such as the compatibility of the hydroxy-containing material with the photopolymerizable epoxy material, the equivalent weight and functionality of the hydroxy-containing material, the physical properties desired in the final cured composition, the desired speed of photopolymerization and other factors that would be readily apparent from the teaching provided herein. For example, useful amounts of one or more hydroxy-containing materials are up to and including 20 weight %, or particular at least 0.5 weight % and up to and including 5 weight % based on the total weight of the photopolymerizable composition, or more particularly at least 1 weight % and up to and including 2 weight % based on the total weight of the four (a) through (d) components of the photopolymerizable composition.

Addition of vinyl ether compounds as chain transfer agents to the photopolymerizable conductive compositions can also be desirable to further increase photopolymerization rates or ensure desired physical properties in the final photocured composition. Examples of useful vinyl ether compounds include but are not limited to, Rapi-Cure™ DVE-3 (triethyleneglycol divinylether), Rapi-Cure™ CHVE (1,4-cyclohexane dimethanoldivinylether), and Rapi-Cure™ HBVE (butanediol monovinylether), all available from Ashland Inc.). These vinyl ether compounds can be present in an amount of at least 0.1 weight % and up to and including 2 weight %, based on the total weight of the four (a) through (d) components of the photopolymerizable compositions.

The photopolymerizable compositions can also contain suitable adjuvants (or additives) such as accelerators, inhibitors, absorbers, stabilizers, pigments, dyes, UV absorbers, viscosity modifiers, flow improvers, surface tension depressants and wetting aids, antioxidants, surfactants, and other ingredients well known to those skilled in the art. Some of these additives can be useful to improve the dispersibility of suspension of the metal nanoparticles described above. Silane coupling agents can be present to improve attachability of the metal nanoparticles to a substrate. The amount of any of these additives in the photopolymerizable compositions can be at least 0.1 weight % and in an amount that a skilled worker would be able to readily determine using routine experimentation.

The amounts and types of essential and optional components in each photopolymerizable composition can be readily adjusted to provide the desired physical and handling properties before and after photocuring (photopolymerization). For example, the photopolymerization rate, stability, fluidity, compressive strength, tensile strength, and durability of various essential and optional components typically are adjusted in part by altering the types and amounts of the (a) through (d) components. Such adjustments typically are carried out empirically based on routine experimentation using the teaching provided herein and other teaching that is readily available in the art.

The photopolymerizable compositions are generally prepared for coating, printing, or other means of application by simply admixing, under "safe light" conditions, the essential components (a) through (d) and any optional components described above. Such components can be mixed and dispersed within suitable inert organic solvents that do not react appreciably with any components incorporated therein. Examples of suitable inert solvents include but are not limited to, acetone, dichloromethane, isopropanol, Dowanol PM, ethylene glycol, and mixtures thereof. When one or more components to be used are in liquid form, those components can act as the "solvent" for the photopolymerizable composition, or used in combination with one or more inert organic solvents. Solvent-free photopolymerizable compositions can be prepared by simply dissolving, dispersing, and mixing the essential components (a) through (d) and any optional components with or without the use of mild heating to facilitate dissolution or dispersion.

When inert organic solvents are used, they can be present in an amount of at least 1 weight % and up to and including 70 weight % or at least 20 weight % and up to and including 50 weight %, based on the total weight of the components (a) through (d) described above. The amount of organic solvents can be judiciously chosen depending upon the particular materials used, the means for applying the resulting photopolymerizable composition, and desired properties including composition uniformity.

Preparing Photopolymerizable Compositions

One or more photopolymerizable epoxy materials are combined with components (b) through (d) described above and any optional components, with or without one or more inert organic solvents.

The photopolymerizable compositions can be prepared by blending one or more polymerizable epoxy materials, which hereinafter will signify epoxy monomer, epoxy prepolymer, epoxy polymer, or mixture thereof, with an effective amount of one or more onium salts or other photoacid generators, one or more electron donor photosensitizers, and metal particles under "safe light" conditions. This mixing can occur in suitable inert solvents (as described above) if desired. The resulting photopolymerizable composition can be provided in the form having a viscosity of at least 1 centipoise and up to and including 100,000 centipoises at 25° C., or it can be provided as a free flowing powder. The photopolymerizable composition can be applied to a variety of substrates (described above) by conventional means and photocured to the tack-free state within 1 second or up to 10 minutes or more.

Examples of suitable inert organic solvents include but are not limited to, acetone, methanol, ethanol, isopropanol, 1-methoxy-2-propanol, methylene chloride, and any other inert organic solvent that does not react appreciably with any of the reactive components of the photopolymerizable compositions.

Alternatively, liquid epoxy polymerizable material can be used as the solvent(s) for mixing of the essential and optional components, or such liquid material can be used in combination with inert organic liquid(s). An inert organic solvent can be used also to aid in obtaining a liquid formulation with suitable viscosity for desired methods of application to a substrate such as various coating methods, ink jet inks, or other materials or operations, such as for printing with relief elements or printing plates. However, solvent-free photopolymerizable compositions also can be prepared by simply dissolving or dispersing the essential components (a) through (d) described above, and any optional components in one of the components that are in liquid form, with or without mild heating.

The amounts of the various components (a) through (d) and any optional components for these formulations are described above.

Photopolymerization (photocuring) can be achieved by activating (irradiating) the electron donor photosensitizer that undergoes photo-induced electron transfer process with the onium salt or other photoacid generator to generate Brönsted acid that causes polymerization of the photopolymerizable epoxy material. Activation of the electron donor photosensitizer can be achieved by exposure to radiant energy such as ultraviolet light as described above. Desirable photopolymerization (photocuring) is desirably achieved using UV or visible irradiation having a wavelength of at least 184.5 nm to and including 700 nm and at intensity of at least 1 mJ/cm$^2$ and up to and including 1000 mJ/cm$^2$ or more typically of at least 1 mJ/cm$^2$ and up to and including 800 mJ/cm$^2$. More details of this process are provided below.

Use of Photopolymerizable Compositions

The photopolymerizable compositions can be photocured or photopolymerized using suitable radiation as described above including ultraviolet light or visible actinic light, or both. One or more suitable light sources can be used for the exposure process. Each precursor article can be exposed individually as a single element, or in alternative embodiments described below, a web (for example, a roll-to-roll continuous web) of multiple precursor articles in multiple portions of a continuous web of substrate can be exposed as the web is passed through exposure stations, or the exposure device is passed over the web. The same or different photopolymerizable compositions can be applied (for example, printed) on both sides of the substrate whether it is in the form of a single element or continuous web. In many embodiments, different conductive metal patterns are formed on opposing sides of the substrate (or continuous web).

For example, the photopolymerizable composition can be applied in a uniform or pattern-wise manner to any suitable substrate using any means for application, such as dip coating, roll coating, hopper coating, spray coating, spin coating, ink jetting, photolithographic imprinting, "flexographic" printing using printing elements including flexographic printing members (such as flexographic printing plates and flexographic printing sleeves), lithographic printing using lithographic printing plates, and gravure or intaglio printing using appropriate printing members.

When the photopolymerizable composition is uniformly applied to a suitable substrate, it can be "imaged" or selectively exposed (or patterned) with exposing radiation through a suitable photomask (masking element) having the desired pattern, and then appropriately removing the non-crosslinked photopolymerizable composition using a suitable "developer" solution. These features or steps can be carried out on both (opposing) sides of the substrate.

Suitable substrates (also known as "receiver elements") can be composed of any suitable material as long as it does not inhibit the purpose of the photopolymerizable composition. For example, substrates can be formed from materials including but are not limited to, polymeric films, metals, glasses (untreated or treated for example with tetrafluorocarbon plasma, hydrophobic fluorine, or a siloxane water-repellant material), silicon or ceramic wafers, fabrics, papers, and combinations thereof (such as laminates of various films, or laminates of papers and films) provided that a uniform layer or pattern of a photopolymerizable composition can be formed thereon in a suitable manner and followed by irradiation to form a uniform photocured layer or photocured pattern on at least one receptive surface thereof. The substrate can be transparent or opaque, and rigid or flexible. The substrate can include one or more auxiliary polymeric or non-polymeric layers or one or more patterns of other materials before a pattern of photopolymerizable composition is applied according to the present invention.

A main surface of the substrate can be treated for example with a primer layer or electrical or mechanical treatments (such as graining) to render that surface a "receptive surface" to improve adhesion of the photopolymerizable composition and resulting photocured layer or pattern, or of a separate adhesive layer. An adhesive layer can be disposed on the substrate main surface and this adhesive layer can have various properties in response to stimuli (for example, it can be thermally activated, solvent activated, or chemically activated) and that serves as a receptive layer. Useful adhesive materials of this type are described for example in [0057] of U.S. Patent Application 2008/0233280 (Blanchet et al.).

In some embodiments, the substrate comprises a separate receptive layer as a receptive surface disposed on a substrate, which receptive layer and substrate can be composed of a material such as a suitable polymeric material that is highly receptive of the photopolymerizable composition. Such receptive layer can have a dry thickness of at least 0.05 µm and up to and including 10 µm, or typically of at least 0.05 µm and up to and including 3 µm, when measured at 25° C.

A surface of the substrate, especially polymeric substrates, can be treated by exposure to corona discharge, mechanical abrasion, flame treatments, or oxygen plasmas, or by coating with various polymeric films, such as poly(vinylidene chloride) or an aromatic polysiloxane as described for example in U.S. Pat. No. 5,492,730 (Balaba et al.) and U.S. Pat. No. 5,527,562 (Balaba et al.) and U.S. Patent Application Publication 2009/0076217 (Gommans et al.).

Suitable substrate materials for forming articles of the present invention include but are not limited to, metallic films or foils, metallic films on polymer, glass, or ceramic supports, metallic films on electrically conductive film supports, semiconducting organic or inorganic films, organic or inorganic dielectric films, or laminates of two or more layers of such materials. For example, useful substrates can include polymeric films such as poly(ethylene terephthalate) films, poly(ethylene naphthalate) films, polyimide films, polycarbonate films, polyacrylate films, polystyrene films, polyolefin films, and polyamide films, silicon and other ceramics, metal foils such as aluminum foils, cellulosic papers or resin-coated or glass-coated papers, glass or glass-containing composites, metals such as aluminum, tin, and copper, and metalized films. The substrate can also include one or more charge injection layers, charge transporting layers, and semi-conducting layers on which the photopolymerizable composition pattern is formed.

Particularly useful substrates are polyesters films such as poly(ethylene terephthalate), polycarbonate, or poly(vinylidene chloride) films with or without surface-treatments as noted above, or coatings.

Useful substrates can have a desired dry thickness depending upon the eventual use of the article formed therefrom, for example its incorporation into various articles or optical or display devices. For example, the substrate dry thickness (including all treatments and auxiliary layers) can be at least 0.001 mm and up to and including 10 mm, and especially for polymeric films, the substrate dry thickness can be at least 0.008 mm and up to and including 0.2 mm.

The substrate used to prepare the articles of this invention can be provided in various forms, such as for example, individual sheets in any size or shape, and continuous webs such as continuous webs of transparent substrates including transparent polyester substrates that are suitable for roll-to-roll operations. Such continuous webs can be divided or formed into individual first, second, and additional portions that can be used to form the same or different photocured patterns from the same or different photopolymerizable compositions.

The photopolymerizable composition can be subjected to an ultrasonication process if desired to increase the dispersibility of the various components and especially the metal particles. After application, any inert organic solvents can be removed by drying or pre-baking procedure that does not adversely affect the remaining components or prematurely cause polymerization. Useful drying conditions can be as low as room temperature for as little as 5 seconds and up to and including several hours depending upon the manufacturing process. In most processes, such as roll-to-roll processes described below, the drying conditions can be at high enough temperatures to remove at least 90% of the inert organic solvent within at least 1 second.

Any applied uniform layer of the photopolymerizable composition can have a dry thickness of at least 0.1 µm and up to and including 10 µm, or typically at least 0.2 µm and up to and including 1 µm, and the optimal dry thickness can be tailored for the intended use of the resulting uniform photocured layer, which generally has about the same dry thickness as the uniform layer of the non-photocured photopolymerizable composition. Such a uniform layer can be applied to both (opposing) sides of the substrate, which uniform layers can have the same or different chemical compositions or dry thickness.

Any applied pattern of the photopolymerizable composition can comprise a grid of lines (or other shapes including circles or an irregular network) having an average thickness (or width) of at least 0.2 µm and up to and including 100 µm, or typically of at least 5 µm and up to and including 10 µm, and the optimal dry thickness (or width) can be tailored for the intended use of the resulting uniform photocured layer, which generally has about the same dry thickness (or width) as the grid lines of the non-photocured photopolymerizable composition.

Thus, the present invention provides articles comprising a substrate and uniform layers or patterns of the photopolymerizable composition of this invention, wherein such articles can be considered "precursor" articles, meaning that they are the first articles produced in methods used to provide conductive articles.

In some embodiments, the same or different photopolymerizable composition can be applied in a suitable manner on both sides (main surfaces) of the substrate to form "duplex" or dual-sided precursor articles, and each applied composition can be in the form of the same or different uniform layer or pattern.

In many embodiments, a pattern of the photopolymerizable composition is applied on one or both (opposing) sides of the substrate (for example as a roll-to-roll web) using a relief element such as elastomeric relief elements derived from flexographic printing plate precursors, many of which are known in the art and some are commercially available, for example as the Cyrel® Flexographic Photopolymer Plates from DuPont and the Flexcel SR and NX Flexographic plates from Eastman Kodak Company.

Particularly useful elastomeric relief elements are derived from flexographic printing plate precursors and flexographic printing sleeve precursors, each of which can be appropriately imaged (and processed if needed) to provide the relief elements for "printing" or applying a suitable pattern.

For example, useful elastomeric relief elements can be comprised of one or more elastomeric layers, with or without a substrate, in which a relief image can be generated using suitable imaging means.

For example, the elastomeric relief element (for example, flexographic printing member) having a relief layer comprising an uppermost relief surface and an average relief image depth (pattern height) of at least 50 µm, or typically having an average relief image depth of at least 100 µm relative from the uppermost relief surface, can be prepared from imagewise exposure of an elastomeric photopolymerizable layer in an elastomeric relief element precursor such as a flexographic printing member precursor, for example as described in U.S. Pat. No. 7,799,504 (Zwadlo et al.) and U.S. Pat. No. 8,142,987 (Ali et al.) and U.S. Patent Application Publication 2012/0237871 (Zwadlo), the disclosures of which are incorporated herein by reference for details of such flexographic printing member precursors. Such elastomeric photopolymerizable layers can be imaged through a suitable mask image to provide an elastomeric relief element (for example, flexographic printing plate or flexographic printing sleeve). In some embodiments, the relief layer comprising the relief pattern can be disposed on a suitable substrate as described in the noted Ali et al. patent. Other useful materials and image formation methods (including development) for provide elastomeric relief images are also described in the noted Ali et al. patent. The relief layer can be different if different patterns of photopolymerizable compositions are applied to opposing sides of the substrate.

In other embodiments, the elastomeric relief element is provided from a direct (or ablation) laser-engraveable elastomer relief element precursor, with or without integral masks, as described for example in U.S. Pat. No. 5,719,009 (Fan), U.S. Pat. No. 5,798,202 (Cushner et al.), U.S. Pat. No. 5,804,353 (Cushner et al.), U.S. Pat. No. 6,090,529 (Gelbart), U.S. Pat. No. 6,159,659 (Gelbart), U.S. Pat. No. 6,511,784 (Hiller et al.), U.S. Pat. No. 7,811,744 (Figov), U.S. Pat. No. 7,947,426 (Figov et al.), U.S. Pat. No. 8,114,572 (Landry-Coltrain et al.), U.S. Pat. No. 8,153,347 (Veres et al.), U.S. Pat. No. 8,187,793 (Regan et al.), and U.S. Patent Application Publications 2002/0136969 (Hiller et al.), 2003/0129530 (Leinenback et al.), 2003/0136285 (Telser et al.), 2003/0180636 (Kanga et al.), and 2012/0240802 (Landry-Coltrain et al.), all of which are incorporated herein for details of such laser-engraveable precursors. Directly engraved relief elements can be prepared without the solvent processing or development that is required for photopolymerizable elastomeric materials.

As noted above, average relief image depth (relief pattern) or an average relief pattern height in the relief pattern is at least 10 µm or typically at least 50 µm relative to the uppermost relief surface. A maximum relief image depth (relief pattern) or relief pattern height can be as great as 1,000 µm, or typically up to and including 750 µm, relative to the uppermost relief surface. The relief pattern generally has a shoulder angle of greater than 25° and up to and including 85° relative to a vertical line from the lowest recess to the uppermost relief surface (that is, the higher should angle of 85° would be closer to the horizontal dimension parallel with the uppermost relief surface), as described in FIG. 4 of U.S. Pat. No. 7,799,504 (noted above).

When the noted elastomeric relief elements are used in the present invention, the photopolymerizable composition can applied in a suitable manner to the uppermost relief surface (raised surface) in the elastomeric relief element. Application can be accomplished using several suitable means and it is desirable that as little as possible is coated onto the sides (slopes) or recesses of the relief depressions. Thus, it is desirable that as much as possible of the photopolymerizable composition is applied only to the uppermost relief surface. Anilox roller systems or other roller application systems, especially low volume Anilox rollers, below 2.5 billion cubic micrometers per square inch (6.35 billion cubic micrometers per square centimeter) and associated skive knives can be used. Optimum metering of the photopolymerizable, electrically conductive composition onto the uppermost relief surface can be achieved by controlling viscosity or thickness, or choosing an appropriate application means.

For example, the photopolymerizable composition can have a viscosity during this application of at least 1 cps (centipoise) and up to and including 5000 cps, or at least 1 cps to and up to and including 1500 cps. The thickness of the photopolymerizable composition on the relief image is generally limited to a sufficient amount that can readily be transferred to a substrate but not too much to flow over the edges of the elastomeric relief element in the recesses during application.

The photopolymerizable composition can be fed from an Anilox or other roller inking system in a measured amount for each printed precursor article. In one embodiment, a first roller can be used to transfer the photopolymerizable composition from an "ink" pan or a metering system to a meter roller or Anilox roller. The photopolymerizable composition is generally metered to a uniform thickness when it is transferred from the Anilox roller to a printing plate cylinder. When the substrate is moved through the roll-to-roll handling system from the printing plate cylinder to an impression cylinder, the impression cylinder applies pressure to the printing plate cylinder that transfers an image from an elastomeric relief element to the substrate.

After the photopolymerizable composition has been applied to the uppermost relief surface (or raised surface) of the elastomeric relief element, it can be useful to remove at least 25 weight % of any inert organic solvents included in the photopolymerizable composition to form a viscous deposit on the uppermost relief surface of the relief image. This removal of inert organic solvents can be achieved in any manner, for example using jets of hot air, evaporation at room temperature, or heating in an oven at an elevated temperature, or other means known in the art for removing a solvent.

Once on the substrate, either in a uniform layer or predetermined pattern of grid lines or other shapes (on one or opposing sides of the substrate), the photopolymerizable composition in the precursor article can be irradiated with suitable radiation as described above from a suitable source such as a fluorescent lamp or LED to provide a photocured layer or photocured pattern on the substrate. For example, photopolymerization can be achieved by the use of UV-visible irradiation having a wavelength ($\lambda_{max}$) of at least 190 nm and up to and including 700 nm and at intensity of at least 1,000 microwatts/cm$^2$ and up to and including 80,000 microwatts/cm$^2$. The irradiation system used to generate such radiation can consist of one or more ultraviolet lamps for example in the form of 1 to 50 discharge lamps, for example, xenon, metallic halide, metallic arc (such as a low, medium or high pressure mercury vapor discharge lamps having the desired operating pressure from a few millimeters to about 10 atmospheres). The lamps can include envelopes capable of transmitting light of a wavelength of at least 190 nm and up to and including 700 nm or typically at least 240 nm and up to and including 450 nm. The lamp envelope can consist of quartz, such as spectrocil or Pyrex. Typical lamps that can be employed for providing ultraviolet radiation are, for example, medium pressure mercury arcs, such as the GE H3T7 arc and a Hanovia 450 W are lamp. Photopolymerization can be carried out using a combination of various lamps, some of or all of which can operate in an inert atmosphere. When using UV lamps, the irradiation flux impinging upon the substrate (or applied layer or pattern) can be at least 0.01 watts/inch$^2$ (0.0197 watts/cm$^2$) to effect sufficient rapid photopolymerization and photocuring of the applied photopolymerizable composition within 1 to 20 seconds in a continuous manner, for example in a roll-to-roll operation.

An LED irradiation device to be used in the photopolymerization can have an emission peak wavelength of 350 nm or more. The LED device can include two or more types of elements having different emission peak wavelengths greater than or equal to 350 nm. A commercial example of an LED device that has an emission peak wavelength of 350 nm or more and has an ultraviolet light-emitting diode (UV-LED), is NCCU-033 that is available from Nichia Corporation.

The result of such irradiation of a precursor article is an intermediate article of this invention comprising the substrate (for example, individual sheets or a continuous web) and having thereon either a photocured layer or a photocured pattern (containing suitable nanoparticles) on one or both sides of the substrate, each of which is derived from a photopolymerizable composition as described above.

The resulting intermediate articles can be used in this form for some applications, but in most embodiments, they are further processed to incorporate a conductive metal on the uniform photocured layer or photocured pattern, each of which includes the metal particles as "seed" materials for further application of metals, such as using electroless metal procedures. For example, the electroless "seed" metal nuclei (that is metal particles) are described above as component (d) but particularly useful metal particles include silver, palladium, and platinum particles that can be electrolessly plated with copper, platinum, palladium, or other metals described below.

One useful method of this invention uses multiple flexographic printing plates (for example, prepared as described above) in a stack in a printing station wherein each stack has its own printing plate cylinder so that each flexographic printing plate is used to print individual substrates, or the stack of printing plates can be used to print multiple portions in a substrate web (on one or both opposing sides). The same or different photopolymerizable composition can be "printed" or applied to a substrate (on same or opposing sides) using the multiple flexographic printing plates.

In other embodiments, a central impression cylinder can be used with a single impression cylinder mounted on a printing press frame. As the substrate (or receiver element) enters the printing press frame, it is brought into contact with the impression cylinder and the appropriate pattern is printed with the photopolymerizable composition. Alternatively, an in-line flexographic printing process can be utilized in which the printing stations are arranged in a horizontal line and are driven by a common line shaft. The printing stations can be coupled to exposure stations, cutting stations, folders, and other post-processing equipment. A skilled worker could be readily determined other useful configurations of equipment and stations using information that is available in the art. For example, an in-the-round imaging process is described in WO 2013/063084 (Jin et al.).

This intermediate article can be immediately immersed in an aqueous-based electroless metal plating bath or solution, or the intermediate article can be stored with just the catalytic pattern comprising corresponding electroless seed metal nuclei (that is, the metal particles described above) for use at a later time.

The intermediate article can be contacted with an electroless plating metal that is the same as or different from the corresponding electroless seed metal nuclei (metal particles described above). In most embodiments, the electroless plating metal is a different metal from the corresponding electroless seed metal nuclei (metal particles).

Any metal that will likely electrolessly "plate" on the corresponding electroless seed metal nuclei (metal particles) can be used at this point, but in most embodiments, the electroless plating metal can be for example copper(II), silver(I), gold (IV), palladium(II), platinum(II), nickel(II), chromium(II), and combinations thereof. Copper(II), silver(I), and nickel(II) are particularly useful electroless plating metals.

The one or more electroless plating metals can be present in the aqueous-based electroless plating bath or solution in an amount of at least 0.01 weight % and up to and including 20 weight % based on total solution weight.

Electroless plating can be carried out using known temperature and time conditions, as such conditions are well known in various textbooks and scientific literature. It is also known to include various additives such as metal complexing agents or stabilizing agents in the aqueous-based electroless plating solutions. Variations in time and temperature can be used to change the metal electroless plating thickness or the metal electroless plating deposition rate.

A useful aqueous-based electroless plating solution or bath is an electroless copper(II) plating bath that contains formaldehyde as a reducing agent. Ethylenediaminetetraacetic acid (EDTA) or salts thereof can be present as a copper complexing agent. For example, copper electroless plating can be carried out at room temperature for several seconds and up to several hours depending upon the desired deposition rate and plating rate and plating metal thickness.

Other useful aqueous-based electroless plating solutions or baths comprise silver(I) with EDTA and sodium tartrate, silver(I) with ammonia and glucose, copper(II) with EDTA and dimethylaminoeborane, copper(II) with citrate and hypophosphite, nickel(II) with lactic acid, acetic acid, and a hypophosphite, and other industry standard aqueous-based electroless baths or solutions such as those described by Mallory et al. in *Electroless Plating: Fundamentals and Applications* 1990.

After the electroless plating procedure to provide a conductive metal pattern on one or more portions of one or opposing sides of the substrate, the resulting product article is removed from the aqueous-based electroless plating bath or solution and can again be washed using distilled water or deionized water or another aqueous-based solution to remove any residual electroless plating chemistry. At this point, the polymeric layer and electrolessly plated metal are generally stable and can be used for their intended purpose.

In some embodiments, the resulting product article can be rinsed or cleaned with water at room temperature as described for example in [0048] of WO 2013/063183 (Petcavich), or with deionized water at a temperature of less than 70° C. as described in [0027] of WO 2013/169345 (Ramakrishnan et al.).

Thus, this method provides a product article comprising a substrate and having disposed thereon a polymeric layer comprising exposed regions and non-exposed regions (on one or opposing sides of the substrate), the exposed regions comprising a pattern of corresponding electroless seed metal nuclei (metal particles described above provided in the photopolymerizable composition) that have been electrolessly plated with the same or different metal within the at least partially crosslinked polymer derived from the photopolymerizable composition, and the non-exposed regions comprising none of the electrolessly plated metal or the photopolymerizable composition.

To change the surface of the electroless plated metal for visual or durability reasons, it is possible that a variety of post-treatments can be employed including surface plating of still at least another (third or more) metal such as nickel or silver on the electrolessly plated metal (this procedure is sometimes known as "capping"), or the creation of a metal oxide, metal sulfide, or a metal selenide layer that is adequate to change the surface color and scattering properties without reducing the conductivity of the electrolessly plated (second) metal. Depending upon the metals used in the various capping procedures of the method, it may be desirable to treat the electrolessly plated metal with a seed metal catalyst in an aqueous-based seed metal catalyst solution to facilitate deposition of additional metals.

In addition, multiple treatments with an aqueous-based electroless metal plating solution can be carried out in sequence, using the same or different conditions. Sequential washing or rinsing steps can be also carried out where appropriate at room temperature or a temperature less than 70° C.

Further, the electroless plating procedures can be carried out multiple times, in sequence, using the same or different electroless plating metal and the same or different electroless plating conditions.

Thus, in some embodiments of the method for providing a product article of this invention, the method comprises:

(i) providing a continuous web of a transparent substrate of any of those materials described above, but particularly transparent polymeric substrates, (ii) forming a photocurable pattern on at least a first portion of the continuous web using a photopolymerizable composition as described above, for example using a flexographic printing member, (iii) exposing the photocurable pattern to radiation (as described above) to form a photocured pattern on the first portion, and (iv) electrolessly plating the photocured pattern on the first portion with an electrically conductive metal, using electroless plating procedures described above.

Embodiments of this method can be carried out on a single side of the substrate, or on opposing sides of the substrate to provide the same or different patterns of electrically conductive metals.

As would be apparent to one skilled in the art, a plurality of portions having the same or different photocured patterns can be provided on this continuous web (on the side of opposing sides) according to the present invention.

For example, a method of this invention for providing a plurality of product articles comprises:

(i) providing a continuous web of a transparent substrate, (ii) forming a photocurable pattern on at least a first portion of the continuous web using a photopolymerizable composition as described above, (iii) exposing the photocurable pattern to radiation (as described above) to form a photocured pattern on the first portion, (iv) electrolessly plating the photocured pattern on the first portion with an electrically conductive metal (as described above, and (v) repeating features (ii) through (iv) on one or more additional portions of the continuous web that are different from the first portion, using the same or different photopolymerizable composition.

This method can be used to similarly form electrically conductive metal patterns on the opposing side of the substrate, especially when the substrate is a continuous web of material such as a polymeric web.

Alternatively, a method of this invention can be used to provide a plurality of precursor articles, the method comprising:

(i) providing a continuous web of a transparent substrate (such as a continuous web of a transparent polymer) as described above, (ii) forming a first photocurable pattern on a first portion of the continuous web by applying a photopolymerizable composition to the first portion using a flexographic printing member as described as described above, (iii') advancing the continuous web comprising the first portion comprising the first photocurable pattern to be proximate exposing radiation, and thereby forming a first photocured pattern on the first portion, (iv') forming a second photocurable pattern on a second portion of the continuous web by applying the same or different photopolymerizable composition to the second portion using the same or different flexographic printing member, (v') advancing the continuous web comprising the second portion comprising the second photocurable pattern to be proximate exposing radiation, and thereby forming a second photocured pattern on the second portion, (vi') optionally, carrying out features (iv') and (v') one or more times on additional respective portions of the continuous web using the same or different photopolymerizable composition and the same flexographic printing member to form additional photocured patterns on the additional respective portions, and (vii') winding up the continuous web comprising multiple photocured patterns.

As would be apparent from other teaching in this disclosure, such method embodiments can be carried out on opposing sides of the continuous web to provide same or different photocured patterns on those opposing sides.

In still other embodiments, a method of this invention can be used to provide a plurality of conductive metal patterns, comprises:

providing a continuous web comprising multiple photocured patterns in respective portions, each photocured pattern being provided by irradiation of a photopolymerizable composition as described above, treating the continuous web comprising multiple photocured patterns with an electroless metal plating solution to provide multiple electrolessly plated metal patterns on the continuous web in the respective portions, and optionally, further treating the multiple electrolessly plated metal patterns with a capping metal to provide multiple capped electrically conductive patterns on the continuous web.

This method can be taken further by:

forming individual electrically conductive articles from the continuous web comprising multiple capped electrically conductive patterns, and assembling the individual electrically conductive articles into the same or different individual devices.

Such method embodiments can be carried out on both opposing sides of the substrates using the same or different photopolymerizable compositions.

Useful product articles prepared according to the present invention can be formulated into capacitive touch screen sensors that comprise suitable conductive grid lines, electrodes, electrical leads, and electrical connectors. For example, the electrodes and tail can be formed by printing the photopolymerizable composition of this invention and electrolessly plating the printed patterns. The electrodes can form an x-y grid that enables the recognition of the point at which the user has interacted with the sensor. For example, the grid can have 16×9 conductive lines or more and a size range of for example, from 2.5 mm by 2.5 mm to 2.1 m by 2.1 m. Top electrodes in the product article can correspond to the Y axis and were provided on a first side of the substrate and bottom electrodes are conductive lines corresponding to the X axis provided on the opposing side of the substrate.

Some details of useful methods and apparatus for carrying out the present invention are described for example in WO 2013/063183 (Petcavich), WO 2013/169345 (Ramakrishnan et al.). Other details of a useful manufacturing system for preparing conductive articles especially in a roll-to-roll manner are provided in PCT/US/062366, filed Oct. 29, 2012 by Petcavich and Jin, the disclosure of which is incorporated herein by reference.

An additional system of equipment and step features that can be used in carrying out the present invention is described in U.S. Ser. No. 14/146,867 filed Jan. 3, 2014 by Shifley, which is incorporated herein by reference for all details that are pertinent to the present invention.

Referring to FIG. 1, it shows a schematic side view of a flexographic printing system 100 that can be used in embodiments of the method of the present invention for roll-to-roll printing the photopolymerizable composition of the present invention on both (opposing) sides of a substrate 150. Substrate 150 is fed as a continuous web from supply roll 102 to take-up roll 104 through flexographic printing system 100. Substrate 150 has a first side 151 and a second side 152.

Flexographic printing system 100 includes two print modules 120 and 140 that are configured to print on the first side 151 of substrate 150, as well as two print modules 110 and 130 that are configured to print on the second (opposing) side 152 of substrate 150. The continuous web of substrate 150 travels overall in roll-to-roll direction 105 (left to right in FIG. 1). However, various rollers 106 and 107 are used to locally change the direction of the continuous web of substrate as needed for adjusting web tension, providing a buffer, and reversing a side for printing. In particular, print module 120 roller 107 serves to reverse the local direction of the continuous web of substrate 150 so that it is moving substantially in a right-to-left direction.

Each of the print modules 110, 120, 130, 140 can include some similar apparatus components including a respective plate cylinder 111, 121, 131, 141, on which is mounted a respective flexographic printing plate 112, 122, 132, 142, respectively. Each flexographic printing member (flexographic printing plate) 112, 122, 132, 142 has raised features 113 defining an image pattern to be printed on the substrate 150. Each print module 110, 120, 130, 140 also includes a respective impression cylinder 114, 124, 134, 144 that is configured to force a side of the substrate 150 into contact with the corresponding flexographic printing member 112, 122, 132, 142.

With reference to the rotation directions of the different components of the print modules 110, 120, 130, 140, it is noted that the impression cylinders 124 and 144 of print modules 120 and 140 (for printing on first side 151 of substrate 150) rotate counter-clockwise in the view shown in FIG. 1, while the impression cylinders 114 and 134 of print modules 110 and 130 (for printing on second side 152 of substrate 150) rotate clockwise in this view.

Each print module 110, 120, 130, 140 also includes a respective Anilox roller 115, 125, 135, 145 for providing the photopolymerizable composition to the corresponding flexographic printing member (flexographic printing plate) 112, 122, 132, 142. As is well known in the printing industry, an Anilox roller is a hard cylinder, usually constructed of a steel or aluminum core, having an outer surface containing millions of very fine dimples, known as cells. Transfer of the photopolymerizable composition would be readily possible using the Anilox roller. In some embodiments, some or all of the print modules 110, 120, 130, 140 also include respective UV curing stations 116, 126, 136, 146 for curing the printed photopolymerizable composition onto substrate 150.

Some embodiments of product articles and devices that can be prepared by embodiments of the present invention are shown in FIGS. 2-5.

Figure 2:
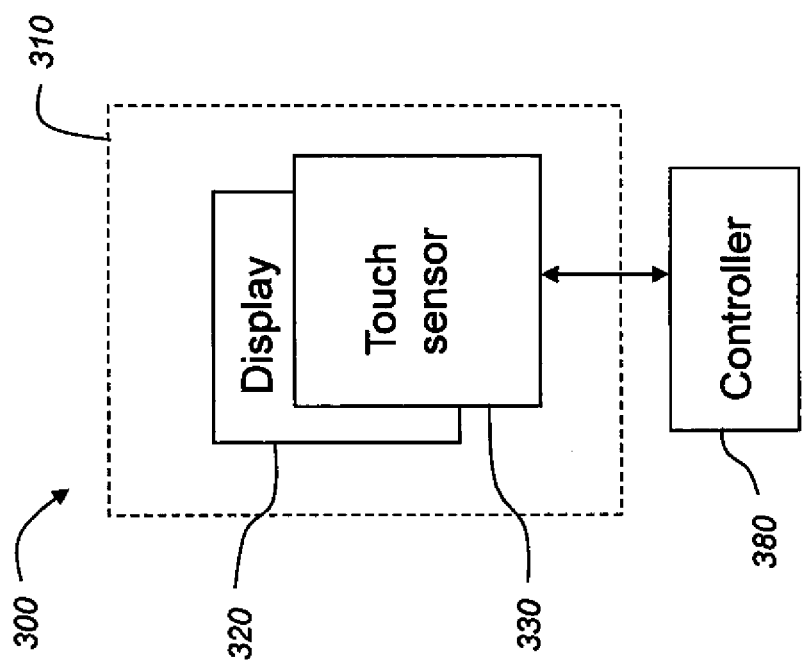
FIG. 2 is a high-level system diagram for an apparatus (device) comprising a touch screen with a touch sensor that can be prepared (printed) using the photopolymerizable composition and method of the present invention.

FIG. 2 shows a high-level system diagram for an apparatus (or device) 300 having a touch screen 310 including a display device 320 and a touch sensor 330 that overlays at least a portion of a viewable area of display device 320. Touch sensor 330 senses touch and conveys electrical signals (related to capacitance values for example) corresponding to the sensed touch to a controller 380. Touch sensor 330 is an example of an article that can be printed on both sides by the flexographic printing system 100 including print modules that incorporate embodiments of flexographic printing (inking) systems described above.

Figure 3:
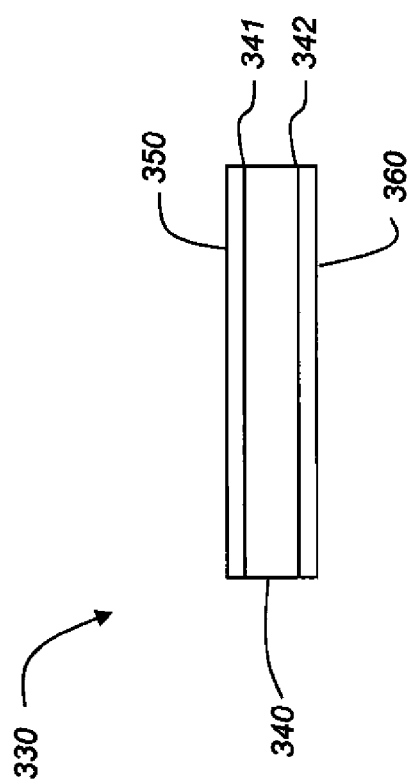
FIG. 3 is a side view of the touch sensor of FIG. 2.

FIG. 3 shows a schematic side view of a touch sensor 330. Transparent substrate 340, for example a transparent polyester such as transparent poly(ethylene terephthalate), has a first conductive pattern 350 printed on a first side 341, and a second conductive pattern 360 printed on a second (opposing) side 342. The length and width of the transparent substrate 340, which is cut from the take-up roll 104 (FIG. 1), is not larger than the flexographic printing plates (or flexographic printing members) 112, 122, 132, 142 of flexographic printing system 100 (FIG. 1), but it could be smaller than the flexographic printing plates (or flexographic printing members) 112, 122, 132, 142. Optionally, the first conductive pattern 350 and the second conductive pattern 360 can be plated using a plating process for improved electrical conductivity after flexographic printing and curing of the patterns. The photopolymerizable composition of this invention can be used to provide the noted conductive patterns 350 and 360 according to the method of this invention.

Figure 4:
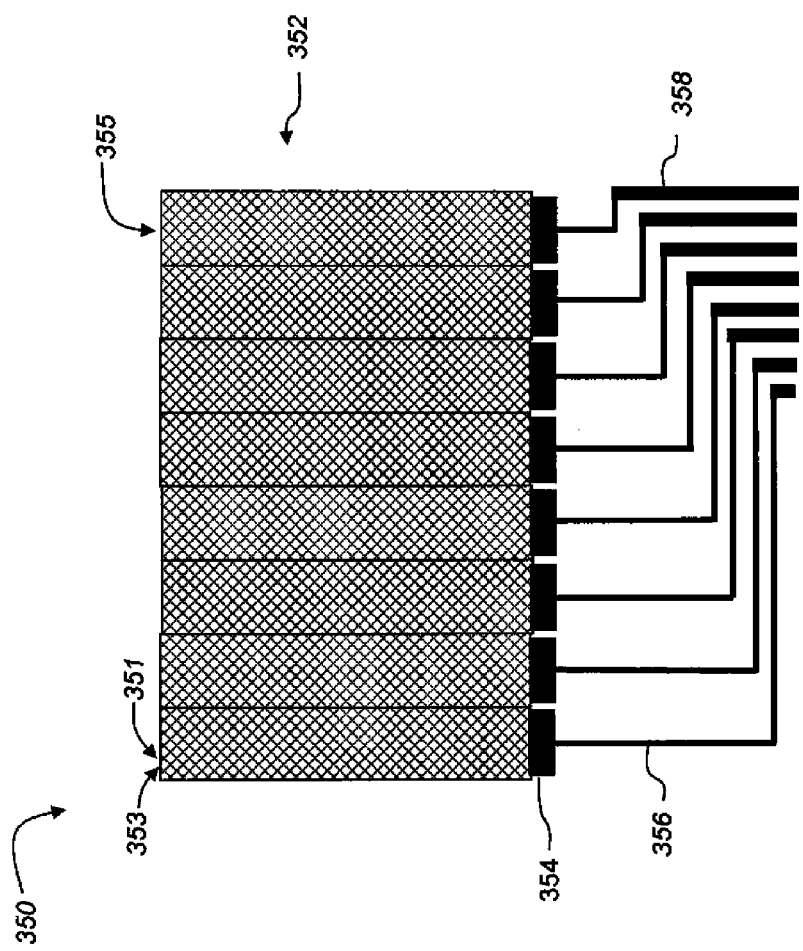
FIG. 4 is a top view of a conductive metal pattern that has been formed on a first side of the touch sensor of FIG. 3.

FIG. 4 shows an example of a conductive pattern 350 that can be printed on first side 341 (FIG. 3) of substrate 340 (FIG. 3) using one or more print modules such as print modules 120 and 140 of flexographic printing system (FIG. 1). Conductive pattern 350 includes a grid 352 including grid columns 355 of intersecting fine lines 351 and 353 that are connected to an array of channel pads 354. Interconnect lines 356 connect the channel pads 354 to the connector pads 358 that are connected to controller 380 (FIG. 2). Conductive pattern 350 can be printed by a single print module 120 in some embodiments. However, because the optimal print conditions for fine lines 351 and 353 (for example, having line widths on the order of 4 to 8 µm) are typically different than for printing the wider channel pads 354, connector pads 358, and interconnect lines 356, it can be advantageous to use one print module 120 for printing the fine lines 351 and 353 and a second print module 140 for printing the wider features. Furthermore, for clean intersections of fine lines 351 and 353 it can be further advantageous to print and cure one set of fine lines 351 using one print module 120, and to print and cure the second set of fine lines 353 using a second print module 140, and to print the wider features using a third print module (not shown in FIG. 1) configured similarly to print modules 120 and 140.

Figure 5:
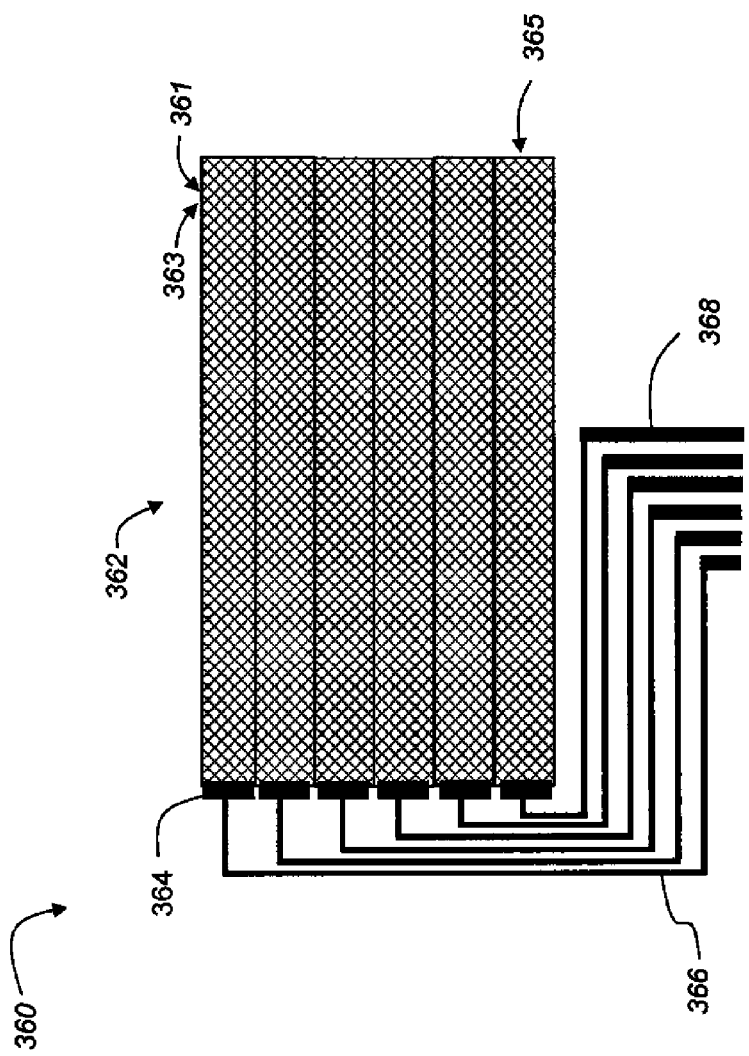
FIG. 5 is a top view of a conductive metal pattern that has been printed on a second (opposing) side of the touch sensor of FIG. 3.

FIG. 5 shows an example of a conductive pattern 360 that can be printed on second side 342 (FIG. 3) of substrate 340 (FIG. 3) using one or more print modules such as print modules 110 and 130 of flexographic printing system 100 (FIG. 1). Conductive pattern 360 includes a grid 362 including grid rows 365 of intersecting fine lines 361 and 363 that are connected to an array of channel pads 364. Interconnect lines 366 connect the channel pads 364 to the connector pads 368 that are connected to controller 380 (FIG. 2). In some embodiments, conductive pattern 360 can be printed by a single print module 110 (FIG. 1). However, because the optimal print conditions for fine lines 361 and 363 (for example, having line widths on the order of 4 to 8 µm) are typically different than for the wider channel pads 364, connector pads 368, and interconnect lines 366, it can be advantageous to use one print module 110 (FIG. 1) for printing the fine lines 361 and 363 and a second print module 130 (FIG. 1) for printing the wider features. Furthermore, for clean intersections of fine lines 361 and 363 it can be further advantageous to print and cure one set of fine lines 361 using one print module 110 (FIG. 1), and to print and cure the second set of fine lines 363 using a second print module 130 (FIG. 1), and to print the wider features using a third print module (not shown in FIG. 1) configured similarly to print modules 110 and 130 (FIG. 1).

Alternatively, in some embodiments conductive pattern 350 (FIG. 4) can be printed using one or more print modules configured like print modules 110 and 130 (FIG. 1), and conductive pattern 360 (FIG. 5) can be printed using one or more print modules configured like print modules 120 and 140 (FIG. 1).

With reference to FIGS. 2-5, in operation of touch screen 310, controller 380 can sequentially electrically drive grid columns 355 via connector pads 358 and can sequentially sense electrical signals on grid rows 365 via connector pads 368. In other embodiments, the driving and sensing roles of the grid columns 355 and the grid rows 365 can be reversed.

The present invention provides at least the following embodiments and combinations thereof, but other combinations of features are considered to be within the present invention as a skilled artisan would appreciate from the teaching of this disclosure:

1. A photopolymerizable composition comprising:
    (a) a photopolymerizable epoxy material,
    (b) a photoacid generator,
    (c) an electron donor photosensitizer having an oxidation potential of at least 0.4 V and up to and including 3 V vs. SCE, and
    (d) metal particles, and optionally
    (e) one or more free-radically polymerizable materials, and
    (f) one or more free radical photoinitiators.

2. The photopolymerizable composition of embodiment 1, wherein the metal particles have a particle size of at least 0.01 µm and up to and including 25 µm.

3. The photopolymerizable composition of embodiment 1 or 2, wherein the metal particles are silver or copper particles and have a particle size of at least 0.02 µm and up to and including 10 µm.

4. The photopolymerizable composition of any of embodiments 1 to 3, further comprising a hydroxy-containing material.

5. The photopolymerizable composition of any of embodiments 1 to 4, comprising all of components (a) through (f), and wherein:

the photopolymerizable epoxy material has at least two polymerizable epoxy groups per molecule and is present in an amount of at least 50 weight % and up to and including 75 weight %, based on the total weight of all six (a) through (f) components, the photoacid generator is an iodonium or sulfonium that is present in an amount of at least 0.1 weight % and up to and including 10 weight %, based on the total weight of all six (a) through (f) components, the electron donor photosensitizer is present in an amount of at least 0.05 weight % and up to and including 2 weight %, based on the total weight of all six (a) through (f) components, the metal particles are silver or copper particles that are present in an amount of at least 1 weight % and up to and including 50 weight %, based on the total weight of all six (a) through (f) components, the one or more free radically polymerizable compounds are present in an amount of at least 20 weight % and up to and including 75 weight %, based on all six (a) through (f) components, and each of the one or more free radical photoinitiators is present in an amount of at least 0.1 weight % and up to and including 10 weight %, based on the total weight of all six (a) through (f) components.

6. The photopolymerizable composition of any of embodiments 1 to 5, wherein the weight ratio of the sum of the weights of components (a), (b), (c), (e), and (f) to the weight of component (d) is from 1:1 to and including 3:1.

7. The photopolymerizable composition of any of embodiments 1 to 6, wherein the electron donor photosensitizer is a pyrene, benzopyrene, perylene, or benzoperylene that is present in an amount of at least 0.05 weight % and up to and including 2 weight %, based on the total weight of components (a), (b), and (d).

8. An article comprising a substrate and having thereon either a uniform layer or a pattern of the photopolymerizable composition of any of embodiments 1 to 7.

9. The article of embodiment 8 having either: a uniform layer of the photopolymerizable composition having an average dry thickness of at least 0.1 μm and up to and including 10 μm; or a pattern of the photopolymerizable composition comprising a grid of lines having an average dry thickness of at least 0.2 μm and up to and including 10 μm.

10. An article comprising a substrate and having thereon either a photocured layer or a photocured pattern, each of which is derived from a photopolymerizable composition of any of embodiments 1 to 7.

11. The article of embodiment 10 having a photocured pattern derived from the photopolymerizable composition, the photocured pattern comprising a grid of lines having an average dry thickness of at least 1 μm and up to and including 10 μm.

12. An article comprising a substrate and having thereon either a uniform electrolessly plated layer or an electrolessly plated pattern, each of which comprises an electrolessly plated metal deposited over a photocured composition that is derived from a photopolymerizable composition of any of embodiments 1 to 7.

13. The article of embodiment 12, wherein the metal particles are silver particles, copper particles, palladium particles, or platinum particles, and the electrolessly plated metal is copper, nickel, or palladium.

14. The article of any of embodiments 8 to 13, wherein the substrate is a continuous polymeric web.

15. A device comprising at least one article of embodiment 10 to 14.

16. A method for providing an electrically conductive article, the method comprising:

(i) providing a continuous web of a transparent substrate, (ii) forming a photocurable pattern on at least a first portion of the continuous web using a photopolymerizable composition of any embodiments 1 to 7, (iii) exposing the photocurable pattern to radiation to form a photocured pattern on the first portion, and (iv) electrolessly plating the photocured pattern on the first portion with an electrically conductive metal.

17. The method of claim 16, further comprising:

(v) repeating features (ii) through (iv) on one or more additional portions of the continuous web that are different from the first portion, using the same or different photopolymerizable composition.

18. A method for providing a plurality of precursor articles, the method comprising:

(i) providing a continuous web of a transparent substrate, (ii) forming a first photocurable pattern on a first portion of the continuous web by applying a photopolymerizable composition to the first portion using a flexographic printing member, which photopolymerizable composition is any of embodiments 1 to 7, (iii') advancing the continuous web comprising the first portion comprising the first photocurable pattern to be proximate exposing radiation, and thereby forming a first photocured pattern on the first portion, (iv') forming a second photocurable pattern on a second portion of the continuous web by applying the same or different photopolymerizable composition to the second portion using the flexographic printing member, (v') advancing the continuous web comprising the second portion comprising the second photocurable pattern to be proximate exposing radiation, and thereby forming a second photocured pattern on the second portion, (vi') optionally, carrying out features (iv') and (v') one or more times on additional respective portions of the continuous web using the same or different photopolymerizable composition and the same or different flexographic printing member to form additional photocured patterns on the additional respective portions, and (vii') winding up the continuous web comprising multiple photocured patterns.

19. A method for providing a plurality of conductive metal patterns, comprising:

providing a continuous web comprising multiple photocured patterns in respective portions, each photocured electrically conductive pattern being provided by irradiation of a photopolymerizable composition of any of embodiments 1 to 7, treating the continuous web comprising multiple photocured patterns with an electroless metal plating solution to provide multiple electrolessly plated metal patterns on the continuous web in the respective portions, and optionally, further treating the multiple electrolessly plated metal patterns with a capping metal to provide multiple capped electrically conductive patterns on the continuous web.

20. The method of embodiment 19, further comprising:

forming individual electrically conductive articles from the continuous web comprising multiple capped electrically conductive patterns, and assembling the individual electrically conductive articles into the same or different individual devices.

The following Examples are provided to illustrate the practice of this invention and are not meant to be limiting in any manner. Unless otherwise indicated, all amounts are given in weight % of the total composition, including any inert organic solvents that are present. One skilled in the art can then determine the weight % of individual components within the ranges provided for each component provided above.

More specifically, the following Examples are provided as an illustration of the practice of the present invention, and to illustrate the beneficial effect of the use of the electron donor photosensitizer on overall polymerization efficiency with the use of a photoacid generator such as an onium salt.

The unexpected curing speed produced by the photopolymerizable compositions of the present invention is best understood by comparing their performances to similar compositions that are outside the present invention.

In all of the results shown below in the Examples, the photocuring efficiency of a given photopolymerizable composition was estimated by measuring the formation of acid after a given time, for example, after irradiation was completed. This photochemically formed acid was measured by a photometric method using 4,4-dimethylamino benzhydrol (shown below as II) as an acid indicator after standardization with trifluoroacetic acid.

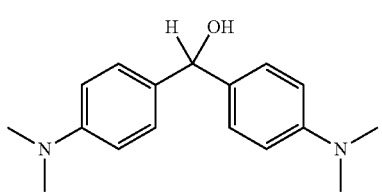

II

This resulting leuco dye is a satisfactory indicator that is colorless in nature but turns blue in an acidic medium (extinction coefficient ~45,000 $M^{-1}$ $cm^{-1}$) following the reaction shown below.

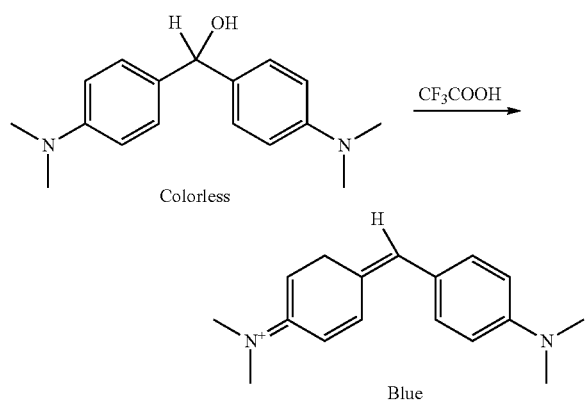

The large extinction coefficient allows determination of very small quantities of acid ($10^{-9}$ moles) with average error of less than 10%.

Comparative Example 1

A photopolymerizable composition outside of the present invention was prepared by mixing 14.7 weight % of epoxy acrylates CN 153 (3.18 g, Sartomer), 10 weight % of poly(ethylene glycol) diacrylate (2.19 g, $M_n$ of 250, Aldrich), 2.1 weight % of poly(ethylene glycol) diacrylate (0.47 g, $M_n$ of 575, Aldrich), 11 weight % of pentaerythritol tetraacrylate (2.40 g, Sartomer), 1 weight % of a triaryl sulfonium salt hexafluorophosphate mixed in 50% propylene carbonate (0.177 g from Aldrich), 1 weight % a triaryl sulfonium salt hexafluoroantimonate mixed in 50% propylene carbonate (0.177 g from Aldrich), 2.4 weight % of free radical photoinitiator hydroxycyclohexyl phenyl ketone (0.53 g, Aldrich), 1.2 weight % of free radical photoinitiator methyl-4'-(methylthio)-2-morpholinopropiophenone (0.27 g, Aldrich), 20 weight % of silver nanoparticles (4.31 g, from Novacentrix, 20 nm average particle size), 1.1 weight % of carbon nanoparticles (0.243 g), 3 weight % of acid indicator 4,4-diemthylamino benzhydrol (shown above), and 35.8 weight % of 1-methoxy isopropanol (7.74 g) solvent.

The resulting polymerizable composition was coated on a glass plate substrate to form a dry uniform layer having about 1 μm thickness. The resulting article was then irradiated using a 200 W medium pressure mercury lamp providing irradiation wavelengths between 190-1500 nm. The acid generated by irradiation was measured using the leuco dye method described above, and the net amount of generated acid was determined from the difference between the exposed and non-exposed regions in the polymeric layer in the article. No dye formation was detected even after prolonged exposure to light. The amount of acid generated was calculated to be less than $10^{-9}$ molar (see TABLE 1 below) by measuring absorption of leuco dye formed at 625 nm (extinction coefficient, $\in=45,000$ $M^{-1}$ $cm^{-1}$) and the path length of $1\times10^{-6}$ cm according to the following equation:

Concentration of acid=Dye produced=Absorbance change at 625 nm/extinction coefficient ϵ*path length The amount of generated acid was estimated (as described above) to be $<10^{-9}$ M (see TABLE I below).

Invention Example 1

A photopolymerizable composition of the present invention was prepared by mixing 14.3 weight % of epoxy acrylates CN 153 (3.18 g, Sartomer), weight % of poly(ethylene glycol) diacrylate (2.19 g, $M_n$ of 250, Aldrich), 2.1 weight % of poly(ethylene glycol) diacrylate (0.47 g, $M_n$ of 575, Aldrich), 11 weight % of pentaerythritol tetraacrylate (2.40 g, Sartomer), 1 weight % of a triaryl sulfonium salt hexafluorophosphate mixed in 50% propylene carbonate (0.177 g from Aldrich), 1 weight % a triaryl sulfonium salt hexafluoroantimonate mixed in 50% propylene carbonate (0.177 g from Aldrich), 2.4 weight % of free radical photoinitiator hydroxycyclohexyl phenyl ketone (0.53 g, Aldrich), 1.2 weight % of free radical photoinitiator methyl-4'-(methylthio)-2-morpholinopropiophenone (0.27 g, Aldrich), 20 weight % of silver nanoparticles (431 g, from Novacentrix, 20 nm average particle size), 1.1 weight % of carbon nanoparticles (0.243 g), ~2 weight % of benzoperylene (S-7, 0.34 g, Adrich), 3 weight % of acid indicator 4,4-diemthylamino benzhydrol (shown above), and 35.8 weight % of 1-methoxy isopropanol (7.74 g) solvent.

The resulting polymerizable composition was coated on a glass plate substrate to form a dry uniform film having about 1 μm thickness. The resulting article was then irradiated using a 200 W medium pressure mercury lamp providing irradiation wavelength of between 190-1500 nm. The acid present generated by irradiation was measured using the leuco dye method described above, and the net amount of generated acid was determined from the difference between the exposed and non-exposed regions in the coating in the article. The amount of generated acid was calculated (as described above) to be 0.01 molar (see TABLE II below) by measuring the absorption of dye formed at 625 nm.

Invention Example 2

A photopolymerizable composition of the present invention was prepared by mixing 14.3 weight % of epoxy acrylates CN 153 (3.18 g, Sartomer), weight % of poly(ethylene glycol) diacrylate (2.19 g, $M_n$ of 250, Aldrich), 2.1 weight % of poly(ethylene glycol) diacrylate (0.47 g, $M_n$ of 575, Aldrich), 11 weight % of pentaerythritol tetraacrylate (2.40 g, Sartomer), 1 weight % of a triaryl sulfonium salt hexafluorophosphate mixed in 50% propylene carbonate (0.177 g from Aldrich), 1 weight % a triaryl sulfonium salt hexafluoroantimonate mixed in 50% propylene carbonate (0.177 g from Aldrich), 2.4 weight % of free radical photoinitiator hydroxycyclohexyl phenyl ketone (0.53 g, Aldrich), 1.2 weight % of free radical photoinitiator methyl-4'-(methylthio)-2-morpholinopropiophenone (0.27 g, Aldrich), 20 weight % of silver nanoparticles (431 g, from Novacentrix, 20 nm average particle size), 1.1 weight % of carbon nanoparticles (0.243 g), 1 weight % of pyrene (S-8, 0.17 g, Aldrich), 3 weight % of acid indicator 4,4-diemthylamino benzhydrol (shown above), and 35.8 weight % of 1-methoxy isopropanol (7.74 g) solvent.

The resulting polymerizable composition was coated on a glass plate substrate to form a dry uniform film having about 1 μm thickness. The resulting article was then irradiated using a 200 W medium pressure mercury lamp providing irradiation wavelength of between 190-1500 nm. The acid present generated by irradiation was measured using the leuco dye method described above, and the net amount of generated acid was determined from the difference between the exposed and non-exposed regions in the coating in the article. The amount of generated acid was calculated (as described above) to be 0.02 molar (see TABLE II below) by measuring the absorption of dye formed at 625 nm.

TABLE II

| | Electron Donor Photosensitizer | Concentration of Acid Produced |
|---|---|---|
| Comparative Example 1 | None | Less than $10^{-9}$ molar |
| Invention Example 1 | S-7 | 0.01 molar |
| Invention Example 2 | S-8 | 0.02 molar |

The invention has been described in detail with particular reference to certain preferred embodiments thereof, but it will be understood that variations and modifications can be effected within the spirit and scope of the invention.

PARTS LIST 100 flexographic printing system
102 supply roll
104 take-up roll
105 roll-to-roll direction
106 roller
107 roller
110 print module
111 plate cylinder
112 flexographic printing plate (or flexographic printing member)
113 raised features
114 impression cylinder
115 Anilox roller
116 UV curing station
120 print module
121 plate cylinder
122 flexographic printing plate (or flexographic printing member)
124 impression cylinder
125 Anilox roller
126 UV curing station
130 print module
131 plate cylinder
132 flexographic printing plate (or flexographic printing member)
134 impression cylinder
135 Anilox roller
136 UV curing station
140 print module
141 plate cylinder
142 flexographic printing plate (or flexographic printing member)
144 impression cylinder
145 Anilox roller
146 UV curing station
150 substrate (or continuous web)
151 first side
152 second (opposing) side
300 apparatus (or device)
310 touch screen
320 display device
330 touch sensor
340 transparent substrate
341 first side
342 second side
350 conductive pattern
351 fine lines
352 grid
353 fine lines
354 channel pads
355 grid column
356 interconnect lines
358 connector pads
360 conductive pattern
361 fine lines
362 grid
363 fine lines
364 channel pads
365 grid row
366 interconnect lines
368 connector pads
380 controller

The invention claimed is:

1. A photopolymerizable composition comprising:
   (a) a photopolymerizable epoxy material,
   (b) a photoacid generator,
   (c) an electron donor photosensitizer having an oxidation potential of at least 0.4 V and up to and including 3 V vs. SCE, and
   (d) metal particles, and
   optionally
   (e) one or more free-radically polymerizable materials, and
   (f) one or more free radical photoinitiators.

2. The photopolymerizable composition of claim 1, wherein the metal particles have a particle size of at least 0.01 μm and up to and including 25 μm.

3. The photopolymerizable composition of claim 1, wherein the metal particles are silver or copper particles and have a particle size of at least 0.02 μm and up to and including 10 μm.

4. The photopolymerizable composition of claim 1, further comprising a hydroxy-containing material.

5. The photopolymerizable composition of claim 1, comprising all of components (a) through (f), and wherein:
   the photopolymerizable epoxy material has at least two polymerizable epoxy groups per molecule and is present in an amount of at least 50 weight % and up to and including 75 weight %, based on the total weight of all six (a) through (f) components,
   the photoacid generator is an iodonium or sulfonium that is present in an amount of at least 0.1 weight % and up to and including 10 weight %, based on the total weight of all six (a) through (f) components,
   the electron donor photosensitizer is present in an amount of at least 0.05 weight % and up to and including 2 weight %, based on the total weight of all six (a) through (f) components, the metal particles are silver or copper particles that are present in an amount of at least 1 weight % and up to and including 50 weight %, based on the total weight of all six (a) through (f) components, the one or more free radically polymerizable compounds are present in an amount of at least 20 weight % and up to and including 75 weight %, based on all six (a) through (f) components, and each of the one or more free radical photoinitiators is present in an amount of at least 0.1 weight % and up to and including 10 weight %, based on the total weight of all six (a) through (f) components.

6. The photopolymerizable composition of claim 1, wherein the weight ratio of the sum of the weights of components (a), (b), (c), (e), and (f) to the weight of component (d) is from 1:1 to and including 3:1.

7. The photopolymerizable composition of claim 1, wherein the electron donor photosensitizer is a pyrene, benzopyrene, perylene, or benzoperylene that is present in an amount of at least 0.05 weight % and up to and including 2 weight %, based on the total weight of components (a), (b), and (d).

8. An article comprising a substrate and having thereon either a uniform layer or a pattern of a photopolymerizable composition that comprises:
(a) a photopolymerizable epoxy material,
(b) a photoacid generator,
(c) an electron donor photosensitizer having an oxidation potential of at least 0.4 V and up to and including 3 V vs. SCE, and
(d) metal particles, and
optionally
(e) one or more free-radically polymerizable materials, and
(f) one or more free radical photoinitiators.

9. The article of claim 8, wherein the substrate is a continuous polymeric web.

10. The article of claim 8 having either: a uniform layer of the photopolymerizable composition having an average dry thickness of at least 0.1 µm and up to and including 10 µm; or a pattern of the photopolymerizable composition comprising a grid of lines having an average dry thickness of at least 0.2 µm and up to and including 10 µm.

11. The article of claim 8, wherein the substrate is a continuous polyester film.

12. A method for providing an electrically conductive article, the method comprising:
(i) providing a continuous web of a transparent substrate,
(ii) forming a photocurable pattern on at least a first portion of the continuous web using a photopolymerizable composition that comprises:
(a) a photopolymerizable epoxy material,
(b) a photoacid generator,
(c) an electron donor photosensitizer having an oxidation potential of at least 0.4 V and up to and including 3 V vs. SCE, and
(d) metal particles, and
optionally
(e) one or more free radically polymerizable compounds, and
(f) one or more free radical photoinitiators,
(iii) exposing the photocurable pattern to radiation to form a photocured pattern on the first portion, and
(iv) electrolessly plating the photocured pattern on the first portion with an electrically conductive metal.

13. The method of claim 12, further comprising:
(v) repeating features (ii) through (iv) on one or more additional portions of the continuous web that are different from the first portion, using the same or different photopolymerizable composition.

14. The method of claim 12, for providing a plurality of precursor articles, comprising:
(ii) forming the first photocurable pattern on a first portion of the continuous web by applying the photopolymerizable composition to the first portion using a flexographic printing member,
(iii') advancing the continuous web comprising the first portion comprising the first photocurable pattern to be proximate exposing radiation, and thereby forming a first photocured pattern on the first portion,
(iv') forming a second photocurable pattern on a second portion of the continuous web by applying the same or different photopolymerizable composition to the second portion using the flexographic printing member,
(v') advancing the continuous web comprising the second portion comprising the second photocurable pattern to be proximate exposing radiation, and thereby forming a second photocured pattern on the second portion,
(vi') optionally, carrying out features (iv') and (v') one or more times on additional respective portions of the continuous web using the same or different photopolymerizable composition and the same or different flexographic printing member to form additional photocured patterns on the additional respective portions, and
(vii') winding up the continuous web comprising multiple photocured patterns.

15. The method of claim 14, further comprising:
forming individual electrically conductive articles from the continuous web comprising multiple photocured patterns, and
assembling the individual electrically conductive articles into the same or different individual devices.

* * * * *